(12) United States Patent
Morishita et al.

(10) Patent No.: US 9,917,011 B2
(45) Date of Patent: Mar. 13, 2018

(54) SEMICONDUCTOR WAFER, SEMICONDUCTOR DEVICE DICED FROM SEMICONDUCTOR WAFER, AND METHOD FOR MANUFACTURING SEMICONDUCTOR DEVICE

(71) Applicant: SHARP KABUSHIKI KAISHA, Sakai, Osaka (JP)

(72) Inventors: Satoshi Morishita, Osaka (JP); Tadashi Yasui, Osaka (JP); Takao Kinoshita, Osaka (JP); Tomotoshi Satoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/125,764

(22) PCT Filed: Apr. 30, 2015

(86) PCT No.: PCT/JP2015/063014
§ 371 (c)(1),
(2) Date: Sep. 13, 2016

(87) PCT Pub. No.: WO2015/178188
PCT Pub. Date: Nov. 26, 2015

(65) Prior Publication Data
US 2017/0005001 A1    Jan. 5, 2017

(30) Foreign Application Priority Data

May 19, 2014    (JP) ................................. 2014-103572

(51) Int. Cl.
*H01L 21/78* (2006.01)
*B24B 27/06* (2006.01)
(Continued)

(52) U.S. Cl.
CPC .............. *H01L 21/78* (2013.01); *B24B 27/06* (2013.01); *B24B 37/105* (2013.01);
(Continued)

(58) Field of Classification Search
CPC ................................................ H01L 2223/5448
See application file for complete search history.

(56) References Cited

U.S. PATENT DOCUMENTS

2009/0278236 A1* 11/2009 Sato .................... H01L 21/6836
257/620

FOREIGN PATENT DOCUMENTS

JP        2006-222258 A       8/2006

* cited by examiner

*Primary Examiner* — Moazzam Hossain
*Assistant Examiner* — Farun Lu
(74) *Attorney, Agent, or Firm* — Birch, Stewart, Kolasch & Birch, LLP

(57) ABSTRACT

A semiconductor wafer is provided with a substrate, a GaN type semiconductor film which is laminated on the substrate, a plurality of element regions which are provided on the GaN type semiconductor film, a dielectric film which is laminated on the GaN type semiconductor film, and a dicing region which has a dicing groove which is provided in a lattice form without passing through the dielectric film described above so as to partition the element regions described above. Then, an end on the element region side of the dicing groove is higher or lower than a central portion of the dicing groove in a width direction in a bottom surface of the dicing groove.

10 Claims, 20 Drawing Sheets

(51) Int. Cl.
*H01L 23/544* (2006.01)
*H01L 29/20* (2006.01)
*H01L 21/311* (2006.01)
*B24B 37/10* (2012.01)
*H01L 21/66* (2006.01)

(52) U.S. Cl.
CPC ...... *H01L 21/31116* (2013.01); *H01L 23/544* (2013.01); *H01L 29/2003* (2013.01); *H01L 22/14* (2013.01); *H01L 2223/5446* (2013.01); *H01L 2224/45144* (2013.01); *H01L 2224/48091* (2013.01); *H01L 2224/48247* (2013.01); *H01L 2224/73265* (2013.01)

SEMICONDUCTOR WAFER, SEMICONDUCTOR DEVICE DICED FROM SEMICONDUCTOR WAFER, AND METHOD FOR MANUFACTURING SEMICONDUCTOR DEVICE

TECHNICAL FIELD

The present invention relates to a semiconductor wafer, a semiconductor device diced from the semiconductor wafer, and a method for manufacturing the same

BACKGROUND ART

In recent years, power devices which have a high breakdown voltage performance and which are used in applications handling large electric currents have been actively developed. In the development of such power devices, nitride semiconductors which are materials which have a high dielectric breakdown electric field and a high saturated electron speed have recently attracted attention. Among these, GaN power devices which use gallium nitride (GaN) are expected to greatly contribute to energy saving in low loss and high speed power switching systems in the future.

In a case of using blade dicing which is generally used for silicon in the manufacturing of the GaN power device described above, since a GaN film is harder than silicon and nitride semiconductors such as GaN and silicon have different lattice constants, thermal expansion coefficients, and the like, a large amount of stress is generated in the vicinity of the interface between the silicon substrate and the GaN film at the time of dicing. Then, when a mechanical shock due to the dicing is imparted to a region in which stress is generated in the vicinity of the interface, cracks or the like are generated starting from the vicinity of the interface. In order to solve this problem, for example, laser dicing is used.

A semiconductor wafer in the prior art which uses laser dicing is, for example, described in Japanese Unexamined Patent Application Publication No. 2006-222258 (PTL 1). In the semiconductor wafer in the prior art, the semiconductor wafer is cut by combining laser dicing and blade dicing.

CITATION LIST

Patent Literature

PTL 1: Japanese Unexamined Patent Application Publication No. 2006-222258

SUMMARY OF INVENTION

Technical Problem

However, even in a case of using laser dicing in the manufacturing of the GaN power device described above, there is a need to remove debris (evaporant residue) which is generated at the time of the laser dicing and there is a problem in that the cost is increased.

In addition, it is also possible to consider methods for removing the GaN film by etching in order to solve the problems in a case of using blade dicing. However, GaN is a substance which is extremely chemically stable and does not dissolve in general acids (hydrochloric acid, sulfuric acid, nitric acid, or the like) or bases and is not etched in any solution at room temperature. For this reason, it is necessary to perform dry etching by reactive ion etching when etching in the semiconductor manufacturing step, and the etching speed is slow and the productivity is poor.

Therefore, an object of the present invention is to provide a semiconductor wafer which has high yield and reliability, a semiconductor device diced from the semiconductor wafer, and a method for manufacturing the same.

Solution to Problem

In order to solve the problem, a semiconductor wafer of the present invention includes a substrate, a GaN type semiconductor film which is laminated on the substrate, a plurality of element regions which have a semiconductor element, which is provided on the GaN type semiconductor film, and a metal ring, which is provided on the GaN type semiconductor film and disposed so as to surround the semiconductor element, a dielectric film which is laminated on the GaN type semiconductor film, and a dicing region which has a dicing groove which opens on the dielectric film and which is provided in a lattice form along a periphery of the metal ring so as to partition the element regions without passing through the dielectric film, in which an end of the dicing groove on the element region side is higher or lower than a central portion of the dicing groove in a width direction in a bottom surface of the dicing groove.

In addition, a semiconductor device of the present invention is diced from the semiconductor wafer described above and at least a part of the dicing groove out of the dicing region described above is cut out so as to remain in the semiconductor device.

In addition, a method for manufacturing a semiconductor device of the present invention includes a step of growing a GaN type semiconductor film on a substrate, a step of forming element regions which have a plurality of semiconductor elements and metal rings disposed so as to surround the semiconductor elements on the GaN type semiconductor film and laminating a dielectric film, a step of forming a dicing region which has a dicing groove which is provided in a lattice form so as to partition the element regions, and a step of dicing the dicing groove and cutting out semiconductor devices which include the semiconductor element and at least a part of the dicing groove, in which the dicing groove is formed such that an end of the dicing groove on the element region side is higher or lower than a central portion of the dicing groove in the width direction without the GaN type semiconductor film being exposed in a bottom surface of the dicing groove.

Advantageous Effects of Invention

According to the present invention, an end of the dicing groove on the element region side is higher or lower than a central portion of the dicing groove in the width direction in the bottom surface of the dicing groove. For this reason, even in a case of using, for example, blade dicing, it is possible to suppress the expansion of cracks, surface chipping, and film peeling by directing stress which is generated at the time of dicing to the outside of the semiconductor wafer. Thus, it is possible to improve the yield of the diced semiconductor devices and also to improve the reliability of the semiconductor devices.

In addition, it is possible to obtain a semiconductor device with high reliability even without using laser dicing with which the cost is high and removal of debris (evaporant residue) is a problem. For this reason, it is possible to manufacture a semiconductor device with high reliability at low cost in a short cutting time.

DESCRIPTION OF EMBODIMENTS

First Embodiment

Figure 1:
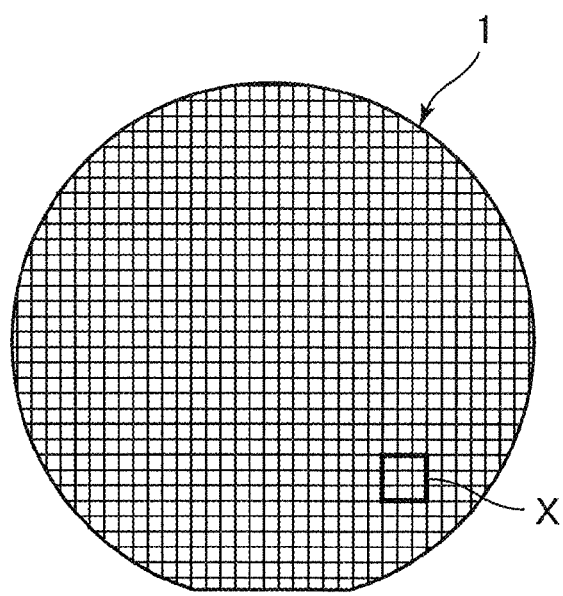
FIG. 1 is a planar diagram which shows a semiconductor wafer of a first embodiment of the present invention.
Figure 2:
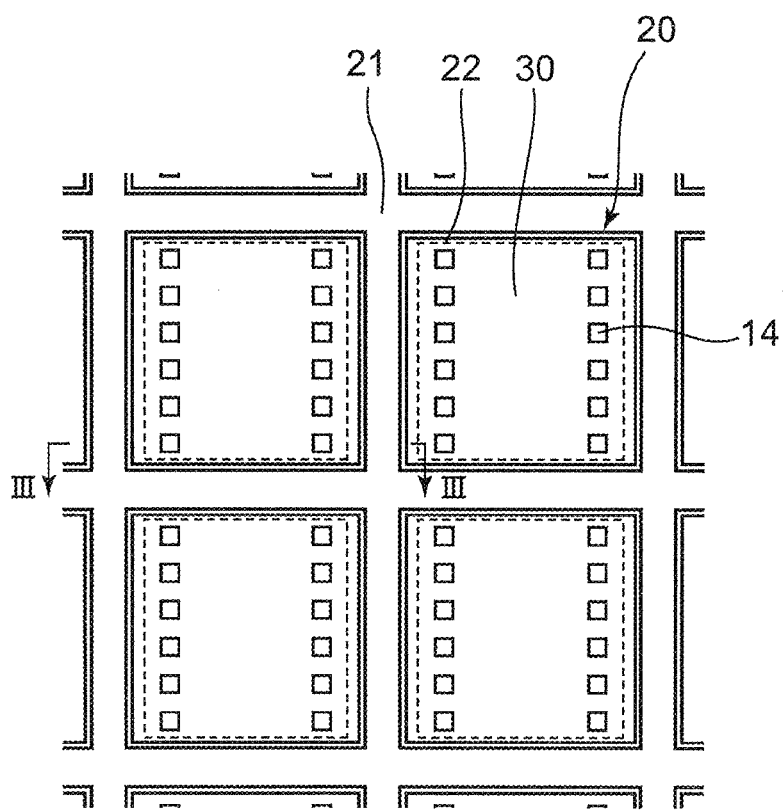
FIG. 2 is an enlarged diagram of an X portion of the semiconductor wafer in FIG. 1.

As shown in FIG. 1 and FIG. 2, a semiconductor wafer 1 of the first embodiment of the present invention is provided with a plurality of element regions 20 and a dicing region 21 which is provided in a lattice form so as to partition the element regions 20. Each of the element regions 20 is provided with a semiconductor element 30 (a circuit portion), bonding pads 14 which are provided on the semiconductor element 30, and a metal ring 22 which is provided so as to surround the semiconductor element 30. The semiconductor element 30 is a GaN type hetero-junction field effect transistor (HFET).

Here, a semiconductor device 70 diced from the semiconductor wafer 1 described above is formed by the element region 20 and a part of the dicing region 21 on the periphery of the element region 20.

Figure 3:
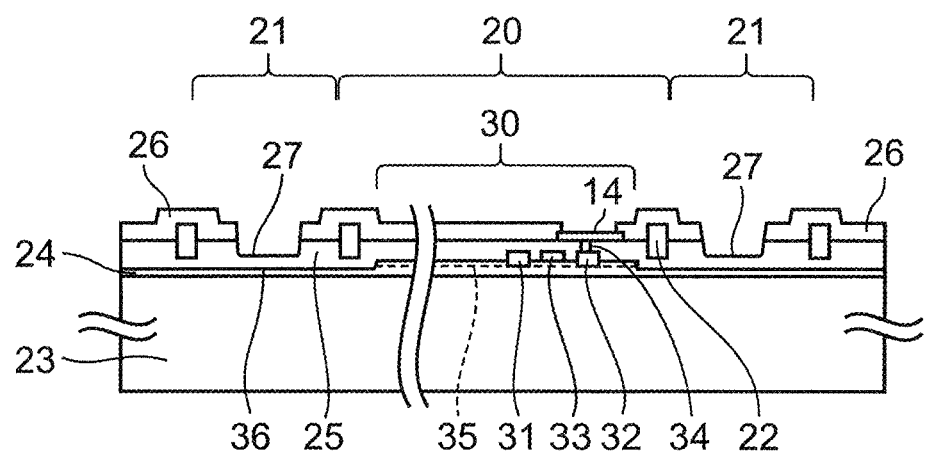
FIG. 3 is a cross-sectional schematic diagram which is viewed from the line in FIG. 2.

As shown in FIG. 3, the semiconductor element 30 described above has a substrate 23 and a GaN type semiconductor film 24 which is laminated on the substrate 23. In the first embodiment, a silicon (Si) substrate with a size of 6 inches and a thickness of 625 µm is used as the substrate 23.

Here, the substrate 23 is not limited to a Si substrate and may be, for example, a sapphire substrate or an SiC substrate.

The GaN type semiconductor film 24 is a nitride semiconductor laminated body which is formed by an undoped AlGaN buffer layer, an undoped GaN channel layer which is laminated on the undoped AlGaN buffer layer, and an undoped AlGaN barrier layer which is laminated on the undoped GaN channel layer.

Here, for convenience of description, the undoped AlGaN buffer layer, the undoped GaN channel layer, and the undoped AlGaN barrier layer are not shown in the diagram. In addition, the semiconductor element 30 is simplified and schematically shown. For this reason, the sizes or intervals of the source electrode, the drain electrode, and the gate electrode are different from the actual sizes and intervals.

A 2-dimensional electron gas layer (a 2 DEG layer) 35 is generated in the vicinity of an interface between the undoped GaN channel layer and the undoped AlGaN barrier layer in the GaN type semiconductor film 24 described above. The 2 DEG layer 35 is only generated in the semiconductor element 30 region due to an element separating groove 36 which is formed on the periphery of the semiconductor element 30.

Here, instead of the GaN channel layer described above, the layer may be an AlGaN channel layer which has a composition of which the band gap is smaller than the AlGaN barrier layer described above. In addition, for example, a layer with a thickness of approximately 1 nm which is formed of GaN may be provided as a cap layer on the AlGaN barrier layer described above.

In addition, the GaN type semiconductor film 24 described above is provided with a source electrode 31 and a drain electrode 32. The source electrode 31 and the drain electrode 32 are formed at intervals from each other in a concave portion which passes through the AlGaN barrier layer and the 2 DEG layer 35 described above and reaches the GaN channel layer. In addition, a gate electrode 33 is formed on the AlGaN barrier layer between the source electrode 31 and the drain electrode 32.

The source electrode 31 and the drain electrode 32 described above are ohmic electrodes and the gate electrode 33 described above is a Schottky electrode. The HFET is formed by the source electrode 31, the drain electrode 32, the gate electrode 33 described above, and an active region.

Here, the active region is a region of a nitride semiconductor laminated body (a GaN channel layer and an AlGaN barrier layer) in which a carrier flows between the source electrode 31 and the drain electrode 32 due to a voltage which is applied to the gate electrode 33 which is disposed between the source electrode 31 and the drain electrode 32 on the AlGaN barrier layer.

A dielectric film 25 formed of $SiO_2$ and a protective film 26 formed of SiN are formed on the GaN type semiconductor film 24 (the AlGaN barrier layer) described above. The dielectric film 25 is formed on the GaN type semiconductor film 24 and the protective film 26 is formed on the dielectric film 25. Vias 34 (only a via on the drain electrode 32 is shown in FIG. 3) as a contact portion are formed in a region on the source electrode 31, the drain electrode 32, and the gate electrode 33 of the dielectric film 25. Each of the electrodes of the source electrode 31, the drain electrode 32, and the gate electrode 33 is connected to the bonding pads 14 (only one bonding pad is shown in FIG. 3) via the vias 34.

Here, $SiO_2$ is used as the material of the dielectric film 25; however, an insulation material such as SiN or polyimide may be used without being limited thereto.

In the semiconductor element 30 described above, a channel is formed in the 2 DEG layer 35 which is generated in the vicinity of the interface between the GaN channel layer and the AlGaN barrier layer and the channel is controlled by applying a voltage to the gate electrode 33 such that the HFET which has the source electrode 31, the drain electrode 32 and the gate electrode 33 is turned on and off. The HFET is operated as a normally-on type transistor which enters an off state by a depletion layer being formed in the GaN channel layer under the gate electrode 33 when a negative voltage is applied to the gate electrode 33 and enters an on state by the depletion layer being removed from the GaN channel layer under the gate electrode 33 when the voltage of the gate electrode 33 is zero.

In addition, a dicing groove 27 is provided in the dicing region 21 which partitions the element regions 20 described above. The dicing groove 27 is formed such that the GaN type semiconductor film 24 is not exposed from a bottom surface 27a of the dicing groove 27 by etching the dielectric film 25 and the protective film 26.

Figure 4:
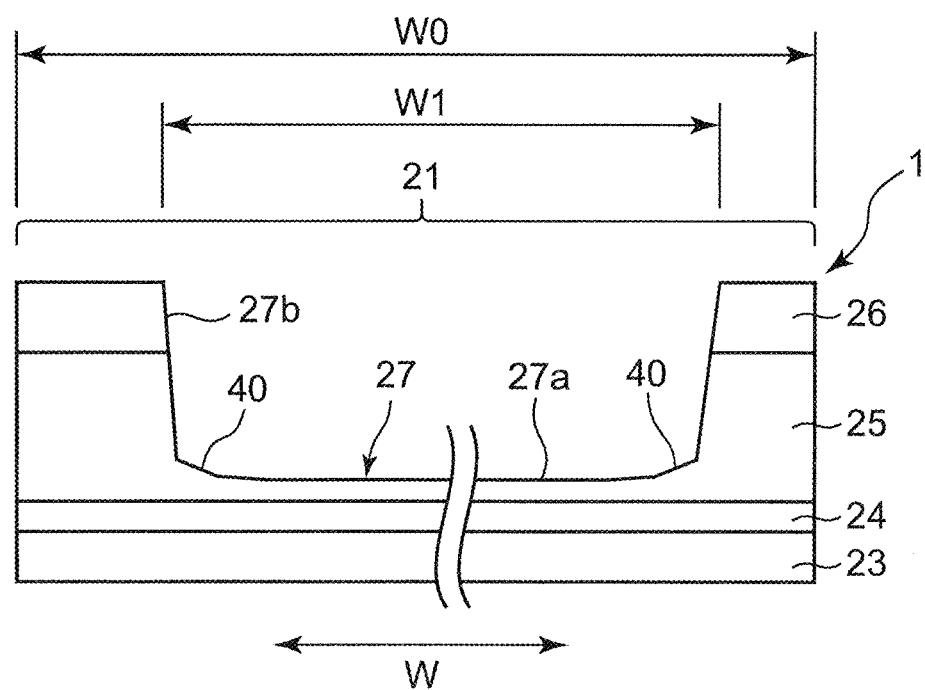
FIG. 4 is a cross-sectional schematic diagram which shows a dicing groove of the semiconductor wafer in FIG. 1.

As shown in FIG. 4, the dicing groove 27 described above has a shape-changed region 40 (changing on an upper side (an opening side) in FIG. 4 with respect to the bottom surface 27a) which is higher than the central portion of the bottom surface 27a of the dicing groove 27 in the width direction W in the bottom surface 27a.

In the semiconductor wafer 1 of the first embodiment, the film thickness of the dielectric film 25 on the bottom surface 27a of the dicing groove 27 is 0.2 μm to 3 μm, a width W0 of the dicing region 21 is 90 μm, and a width W1 of the dicing groove 27 is 70 μm.

Here, air discharge is generated with a low application voltage in a case where the GaN type semiconductor film is exposed from the dicing groove 27. For example, when the distance between the dicing groove 27 and the bonding pad 14 is 70 μm, air discharge is generated with the application of approximately 600 V.

With respect to this, in the semiconductor wafer 1 described above, even when a high voltage of 600 V to 1000 V is applied to the bonding pad 14, the GaN type semiconductor film 24 is not exposed from the surface of the bottom surface 27a of the dicing groove 27. For this reason, in a case of testing the semiconductor element 30 in a wafer state, it is possible to carry out a pressure proof test or the like by applying a high voltage in a wafer state without destroying the semiconductor element 30.

Subsequently, description will be given of a method for manufacturing the semiconductor wafer 1 described above according to FIG. 5 to FIG. 9.

Figure 5:
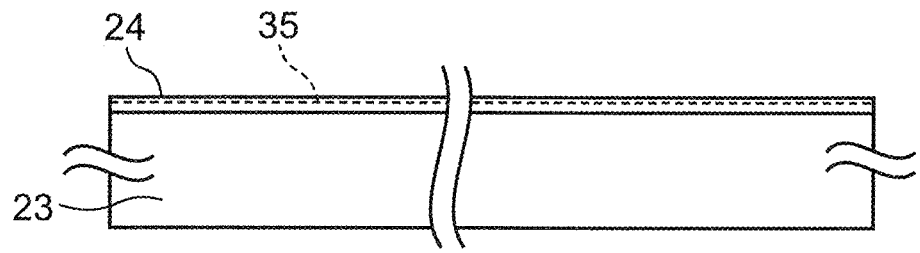
FIG. 5 is a cross-sectional schematic diagram for illustrating a method for manufacturing the semiconductor wafer in FIG. 1.

Firstly, as shown in FIG. 5, the GaN type semiconductor film 24 is formed on the Si substrate 23 by laminating the undoped AlGaN buffer layer, the undoped GaN channel layer, and the undoped AlGaN barrier layer in order using a metal organic chemical vapor deposition (MOCVD) method. The thickness of the undoped GaN channel layer is, for example, 1 μm and the thickness of the undoped AlGaN barrier layer is, for example, 30 nm. The 2 DEG layer 35 is generated in the vicinity of the interface between the undoped GaN channel layer and the undoped AlGaN barrier layer.

Figure 6:
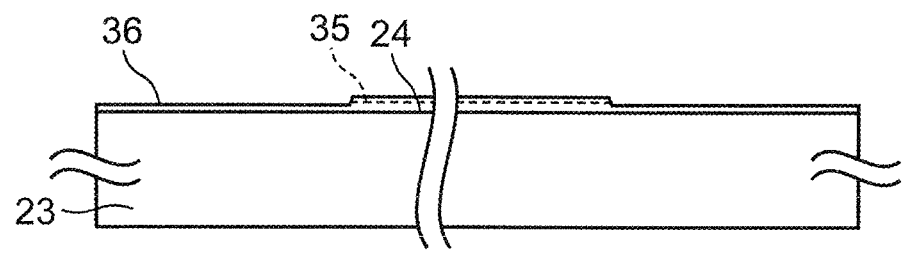
FIG. 6 is a cross-sectional schematic diagram for illustrating the method for manufacturing the semiconductor wafer following FIG. 5.

Then, as shown in FIG. 6, the element separating groove 36 which passes through the 2 DEG layer 35 is formed in a region on the GaN type semiconductor film 24 in which the semiconductor element 30 is not formed. The element separating groove 36 is formed by patterning a resist by a general photolithography method and using a reactive ion etching (RIE) device which uses chlorine-based gas.

Figure 7:
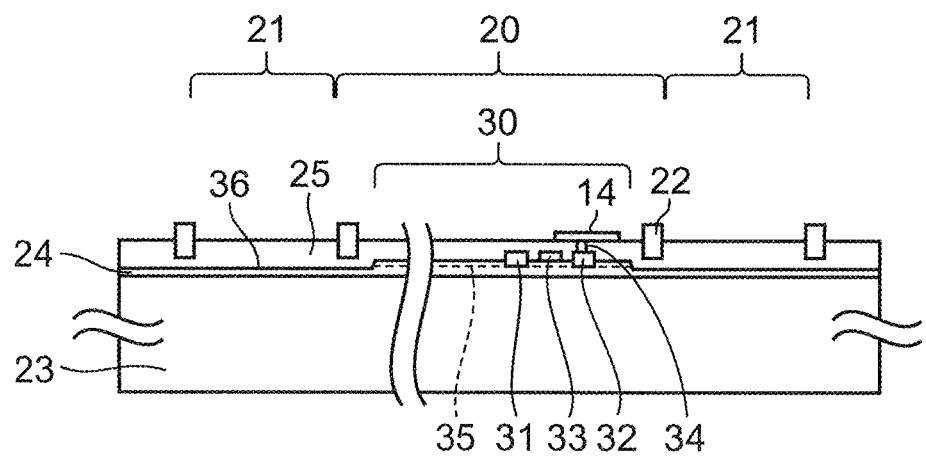
FIG. 7 is a cross-sectional schematic diagram for illustrating the method for manufacturing the semiconductor wafer following FIG. 6.

Next, as shown in FIG. 7, the semiconductor element 30 is formed. That is, concave portions which pass through the AlGaN barrier layer and the 2 DEG layer 35 and reach the GaN channel layer are formed at intervals from each other on the GaN type semiconductor film 24 in the element region 20. It is sufficient if the concave portions are able to pass through the 2 DEG layer 35 from the surface of the AlGaN barrier layer and are formed so as to have, for example, a depth of 70 nm by patterning a resist by a general photolithography method and using RIE which uses chlorine-based gas in the same manner as the element separating groove 36.

Subsequently, the source electrode 31 and the drain electrode 32 which are ohmic electrodes are formed by laminating Ti, Al, and TiN in the concave portion in order by sputtering. An ohmic contact is obtained between the 2 DEG layer 35 and the ohmic electrode by annealing a substrate in which the source electrode 31 and the drain electrode 32 are formed, for example, at 400° C. or more to 500° C. or less for 10 or more minutes.

Subsequently, the gate electrode 33 formed of WN and W laminated films which are formed by sputtering is formed on the GaN type semiconductor film 24 between the source electrode 31 and the drain electrode 32.

Subsequently, the dielectric film 25 which has a film thickness of, for example, 1.0 μm to 4.5 μm is formed by laminating a SiN film and a SiO$_2$ film produced by p-CVD (plasma CVD) on the GaN type semiconductor film 24.

Here, the film thickness of the dielectric film 25 changes according to the metal film thickness of the semiconductor element to be manufactured.

Figure 8:
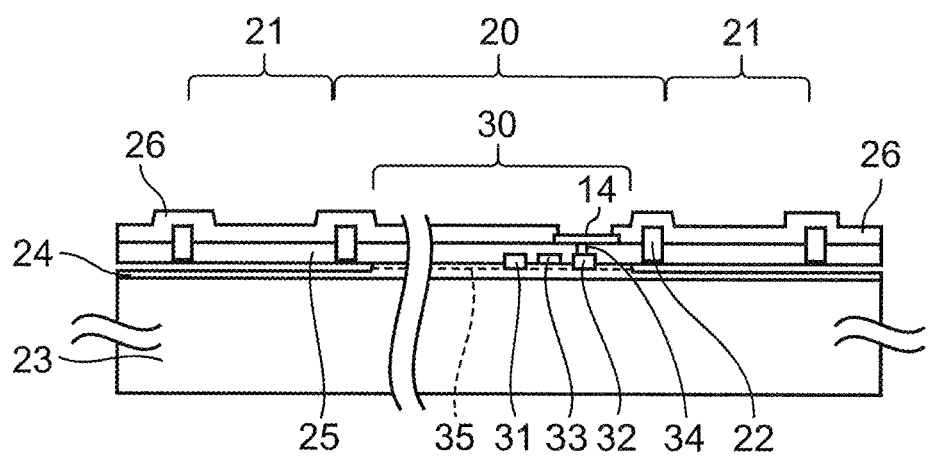
FIG. 8 is a cross-sectional schematic diagram for illustrating the method for manufacturing the semiconductor wafer following FIG. 7.
Figure 9:
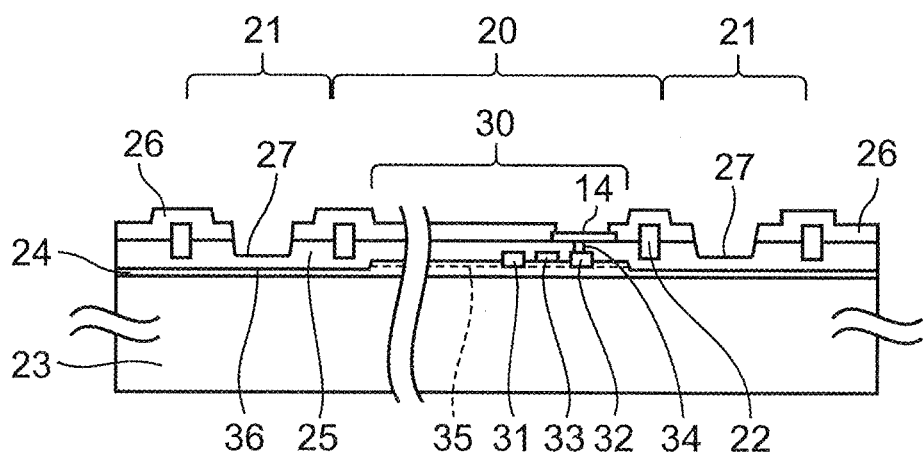
FIG. 9 is a cross-sectional schematic diagram for illustrating the method for manufacturing the semiconductor wafer following FIG. 8.

Subsequently, the vias 34 (only the via on the drain electrode 32 is shown in FIGS. 7 to 9) are formed as contact portions in a region on the source electrode 31, the drain electrode 32, and the gate electrode 33 of the dielectric film 25. Then, each of the electrodes of the source electrode 31, the drain electrode 32, and the gate electrode 33 is connected to the bonding pads 14 which are provided on the dielectric film 25 via the vias 34.

Next, the metal ring 22 is formed on the periphery of the semiconductor element 30 on the dielectric film 25. The metal ring 22 is formed by patterning a resist by a general photolithography method and patterning each of the TiN, AlCu, and TiN laminated films using a general RIE method which uses chlorine-based gas.

Next, as shown in FIG. 8, the protective film 26 formed of SiN produced by p-CVD and which has a film thickness of, for example, 0.9 μm is formed on the dielectric film 25. Here, the bonding pads 14 are exposed in order to be connected to a signal processing circuit or the like and are not covered by the protective film 26.

After that, as shown in FIG. 9, the dicing groove 27 is formed by etching the protective film 26 and the dielectric film 25 in the dicing region 21. The dicing groove 27 is formed by patterning a resist using a photolithography method and dry etching using RIE which uses fluorine-based gas.

The dicing groove 27 of the semiconductor wafer 1 of the first embodiment shown in FIG. 4 is obtained, for example, by dry etching using a RIE device in which the RF power is 750 W, the discharge pressure is 1700 mTorr, the flow amount of gas is Ar=800 sccm, and CF4=120 sccm.

Here, in a semiconductor wafer in the prior art in which a dielectric film is formed on a GaN type semiconductor film, since interlayer stress between the Si substrate 23 and the vicinity of the GaN type semiconductor film 24 is large during the dicing, there are cases where interlayer cracks are easily generated compared to the semiconductor wafer in the prior art in which the dielectric film on the bottom surface of a dicing groove is completely removed and the GaN type semiconductor film is exposed from the bottom surface.

Figure 10:
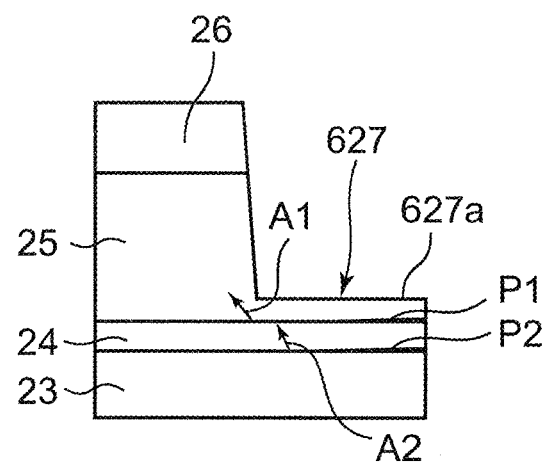
FIG. 10 is a partial cross-sectional schematic diagram which shows the expansion of interlayer cracks and surface chipping which are generated when dicing a semiconductor wafer in which a bottom surface of a dicing groove is substantially flat.

This is for the following reason. That is, as shown in FIG. 10, when dicing a semiconductor wafer in which a bottom surface 627a of a dicing groove 627 is substantially flat, stress (a crack) P1 generated in the vicinity of the interface between the GaN type semiconductor film 24 and a dielectric film 625 is directed in the direction of an arrow A1 and stress (a crack) P2 generated in the vicinity of the interface between the Si substrate 23 and the GaN type semiconductor film 24 is directed in the direction of an arrow A2. This is because there are cases where it is not possible to let the stress successfully escape to the outside of the semiconductor wafer for this reason.

Here, the generation of interlayer cracks and surface chipping at the time of blade dicing was examined by dicing each of (1) a semiconductor wafer which does not have a dicing groove, (2) a semiconductor wafer which has a dicing groove but in which the bottom surface of the dicing groove is substantially flat, and (3) the semiconductor wafer 1 of the first embodiment. Here, the semiconductor wafers with the configurations (1) and (2) described above have the same configuration as the semiconductor wafer 1 apart from the dicing groove.

Figure 12:
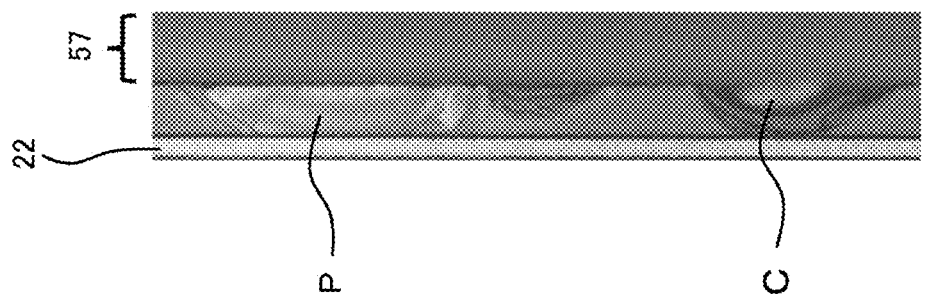
FIG. 12 is a diagram of an optical microscope image which shows a dicing surface when dicing a semiconductor wafer in which a dicing groove is not formed.

As shown in FIG. 12, in the semiconductor wafer of (1), surface chipping C and interlayer cracks P which expanded from a cutting portion 57 reached the metal ring 22 at the time of blade dicing. The interlayer cracks P are cracks generated in the vicinity of the GaN type semiconductor film 24 and it is not possible to stop the expansion thereof by the metal ring 22. For this reason, there were cases where the interlayer cracks P expanded to the element region.

Figure 13:
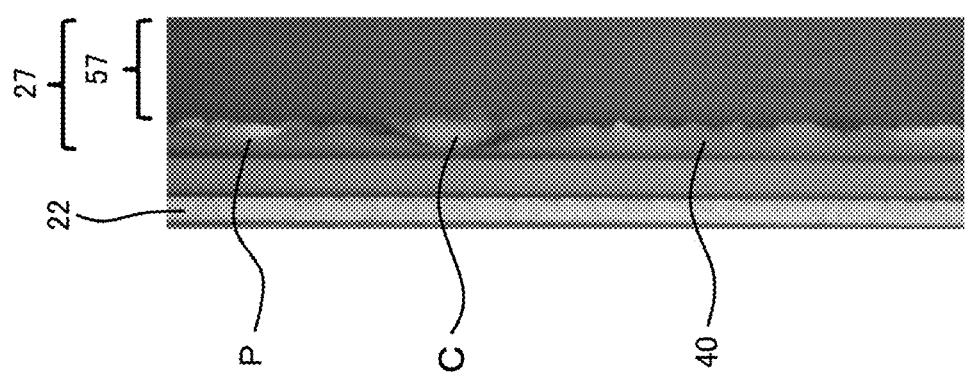
FIG. 13 is a diagram of an optical microscope image which shows a dicing surface when dicing a semiconductor wafer in which a dicing groove is formed, but the bottom surface of the dicing groove is substantially flat.

As shown in FIG. 13, in the semiconductor wafer of (2), the surface chipping C and the interlayer cracks P which expanded from the cutting portion 57 at the time of blade dicing stopped at the wall surface of the dicing groove and did not reach the metal ring.

Figure 14:
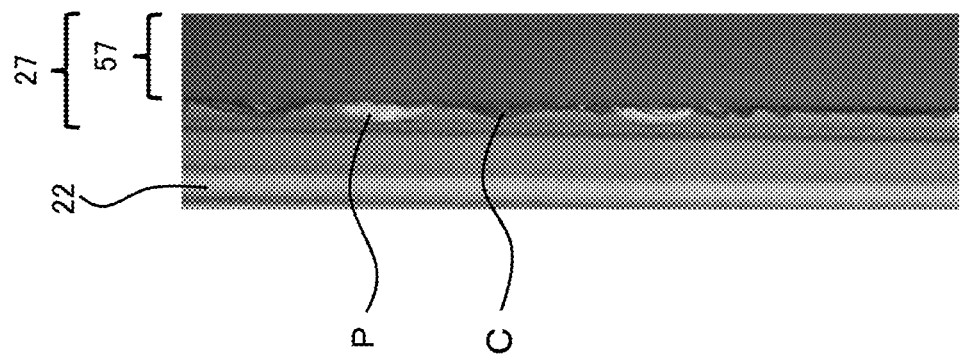
FIG. 14 is a diagram of an optical microscope image which shows a dicing surface when dicing the semiconductor wafer in FIG. 1.

As shown in FIG. 14, in the semiconductor wafer 1 of (3), the surface chipping C and the interlayer cracks P which expanded from the cutting portion 57 at the time of blade dicing stopped before a wall surface 27b of the dicing groove 27.

From the results described above, it is understood that it is possible to suppress the expansion of the surface chipping C and the interlayer cracks P by providing the dicing groove. In particular, it is understood that it is possible to improve the yield and to dice the semiconductor device 70 with high reliability by reliably suppressing the expansion of the surface chipping C and the interlayer cracks P by providing the shape-changed region 40 in an end on the element region 20 side of the bottom surface 27a of the dicing groove 27.

Figure 11:
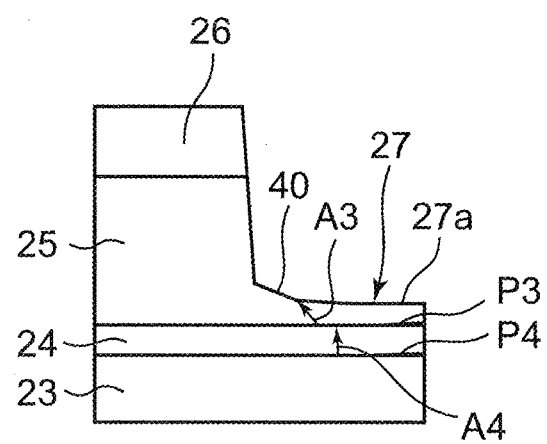
FIG. 11 is a partial cross-sectional schematic diagram which shows the expansion of interlayer cracks and surface chipping which are generated when dicing the semiconductor wafer in FIG. 1.

That is, in the semiconductor wafer 1 with the configuration described above, by providing the shape-changed region 40 on the bottom surface 27a on the element region 20 side of the dicing groove 27 and making the end on the element region 20 side described above of the dicing groove 27 higher than the central portion of the dicing groove 27 in the width direction W on the bottom surface 27a of the dicing groove 27, it is possible to direct stress (a crack) P3 generated in the vicinity of the interface between the GaN type semiconductor film 24 and the dielectric film 25 in the direction of an arrow A3 as shown in FIG. 11. In addition, it is possible to direct stress (a crack) P4 generated in the vicinity of the interface between the Si substrate 23 and the GaN type semiconductor film 24 which are generated when the dicing further proceeds in the direction of an arrow A4. In other words, since it is possible to direct the stress which is generated at the time of dicing, particularly at the time of blade dicing, to the outside of the semiconductor wafer 1, it is possible to improve the yield of the semiconductor device 70 to be diced and to improve the reliability of the semiconductor device 70 to be diced by suppressing the expansion of cracks, surface chipping, and film peeling which are generated at the time of dicing.

In addition, it is possible to obtain the semiconductor device 70 with high reliability even without using laser dicing with which the cost is high and removal of debris (evaporant residue) is a problem. For this reason, it is possible to manufacture the semiconductor device 70 at a low cost in a short cutting time.

Second Embodiment

Figure 15:
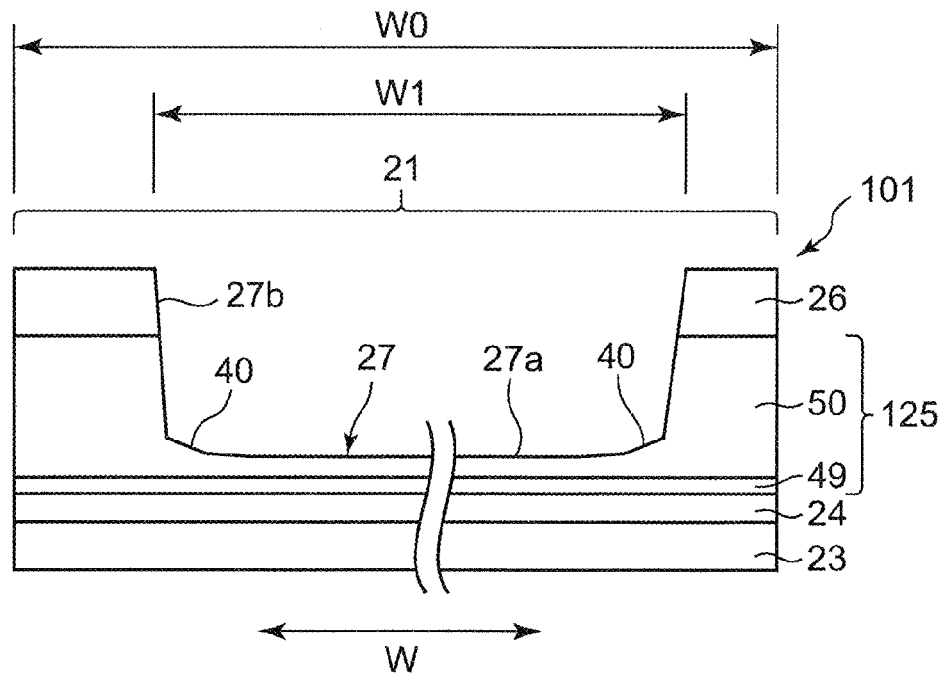
FIG. 15 is a cross-sectional schematic diagram of a semiconductor wafer of a second embodiment of the present invention.

As shown in FIG. 15, in a semiconductor wafer 101 of the second embodiment, the dielectric film 25 of the semiconductor wafer 1 in the first embodiment is formed of multiple film layers of two layers formed of first and second dielectric films 49 and 50. Here, the same numbers are given to the same constituent portions as the first embodiment described above and the description of the first embodiment applies thereto.

As a dielectric film 125 in the semiconductor wafer 101 of the second embodiment, a SiN film with a film thickness of 2.0 µm or less produced by p-CVD is used, for example, as the first dielectric film 49 and a $SiO_2$ film with a film thickness of 2.0 µm or less produced by p-CVD is used as the second dielectric film 50.

Here, the relationship between the film thickness of the second dielectric film 50 and the expansion of the cracks P at the time of blade dicing was examined in a case where the film thickness of the first dielectric film 49 was 0.75 µm. Here, the dicing was performed such that the distance from the cutting portion of the dicing groove 27 to the metal ring 22 in a cross-sectional view was 25 µm.

Figure 16:
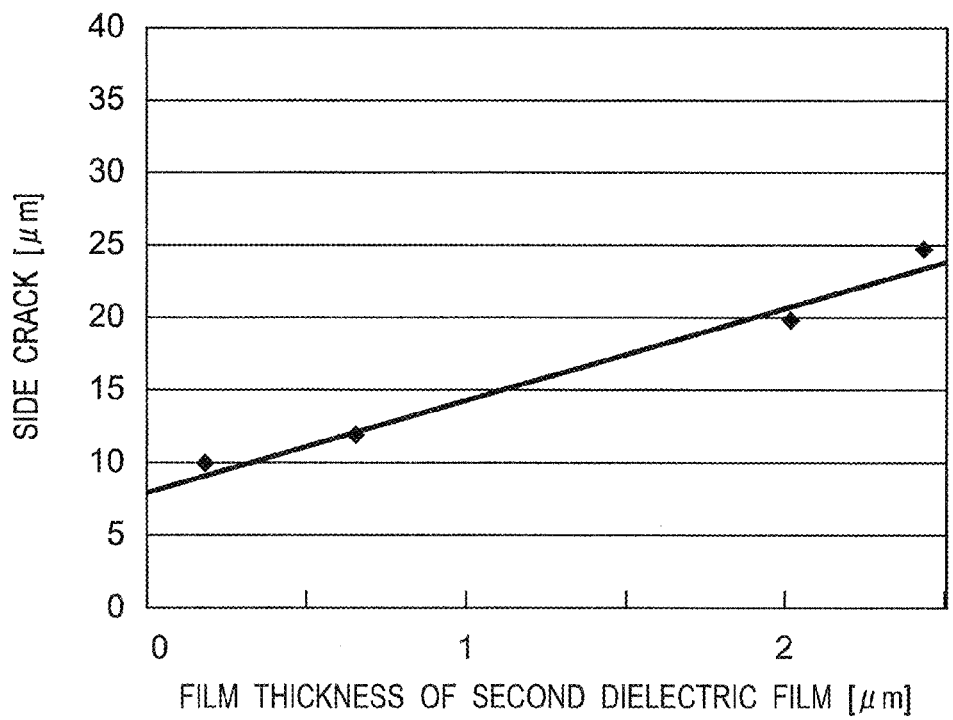
FIG. 16 is a correlation diagram between the width of generated interlayer cracks and the film thickness of a second dielectric film when dicing the semiconductor wafer in FIG. 15.

As shown in FIG. 16, it is understood that the expansion of the cracks P is suppressed to 20 µm or less before a position (25 µm) reaching the metal ring 22 in a case where the film thickness of the second dielectric film 50 is 2.0 µm or less.

Figure 17:
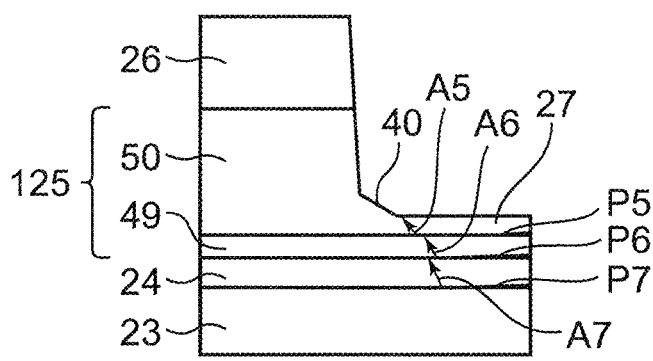
FIG. 17 is a partial cross-sectional schematic diagram which shows the expansion of interlayer cracks and surface chipping which are generated when dicing the semiconductor wafer in FIG. 15.

By multi-layering the dielectric film 125, the maximum film thickness of one layer which configures the dielectric film is small compared to a single layer dielectric film with the same film thickness. For this reason, as shown in FIG. 17, it is possible to direct stress (a crack) P5 generated in the vicinity of the interface between the first dielectric film 49 and the second dielectric film 50 at the time of blade dicing in the direction of an arrow A5 and direct stress (a crack) P6 generated in the vicinity of the interface between the GaN type semiconductor film 24 and the dielectric film 25 in the direction of an arrow A6. Then, it is possible to direct stress (crack) P7 generated in the vicinity of the interface between the Si substrate 23 and the GaN type semiconductor film 24 when the dicing further proceeds in the direction of an arrow A7. In other words, since it is possible to direct the stress which is generated by dicing to the outside of the semiconductor wafer 101 at the position before the wall surface 27b of the dicing groove 27, it is possible to improve the yield of the diced semiconductor device 70 and to improve the reliability of the diced semiconductor device 70 by reliably suppressing the expansion of cracks, surface chipping, and film peeling.

In addition, the relationship between the cracks and the film thickness of the dielectric film 125 on the bottom surface 27a of the dicing groove 27 at the time of blade dicing was examined in a case where the dielectric film 125 is formed by 2 layers of the first and second dielectric films 49 and 50.

Figure 18:
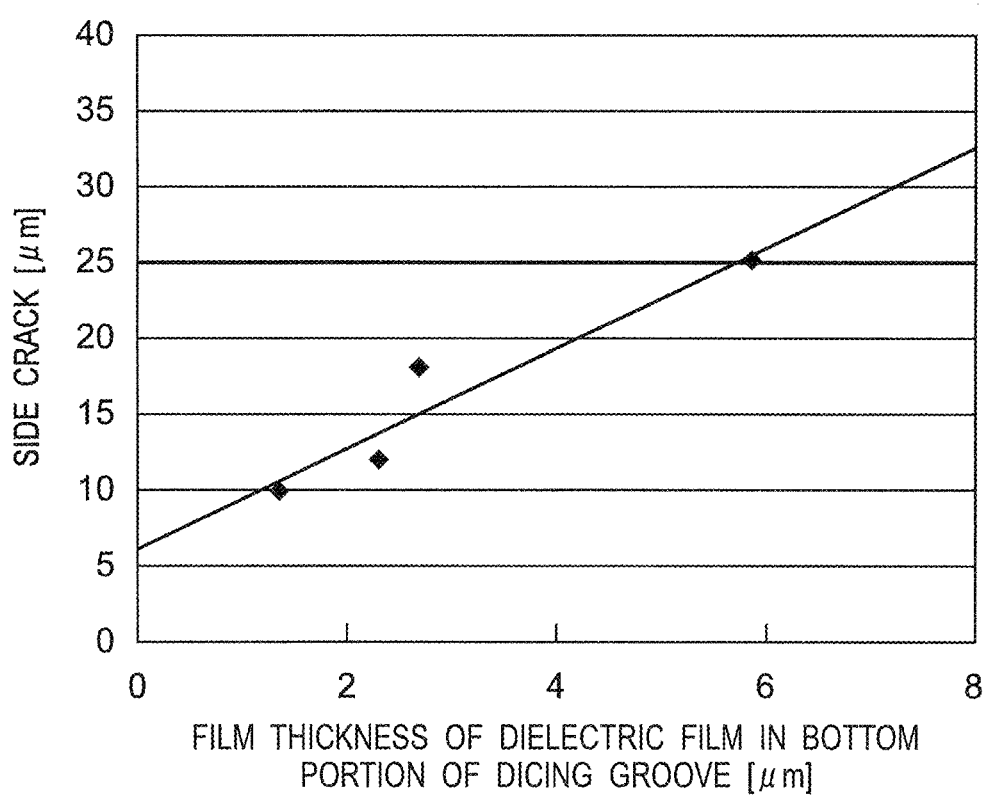
FIG. 18 is a correlation diagram between the width of generated cracks and the film thickness of a dielectric film in a bottom surface of a dicing groove when dicing the semiconductor wafer in FIG. 15.

As shown in FIG. 18, it is understood that it is possible to suppress the expansion of cracks to 20 µm or less in a case where the film thickness of the dielectric film 125 on the bottom surface 27a of the dicing groove 27 is 3.0 µm or less.

In other words, in a case of configuring the dielectric film 125 by two layers of the first and second dielectric films 49 and 50, when the film thickness of the dielectric film 125 on the bottom surface 27a of the dicing groove 27 is 3.0 µm or less due to variations in the processing of the dicing groove 27, it is possible to improve the yield of the diced semiconductor device 70 and to improve the reliability of the diced semiconductor device 70 by reliably suppressing the expansion of cracks, surface chipping, and film peeling which are generated in the vicinity of the interface between the Si substrate 23 and the GaN type semiconductor film 24.

Furthermore, since it is possible to make the film thickness of the dielectric film 125 on the bottom surface 27a of the dicing groove 27 large, it is possible to reduce the processing depth of the dicing groove 27. Due to this, it is possible to shorten the processing time of the dicing groove 27 and to reduce the processing cost by thinning the film thickness of the resist which is used when processing the dicing groove 27.

Third Embodiment

Although not shown in the diagram, a semiconductor wafer 201 of the third embodiment is formed by a dielectric film 225 which is formed by further multi-layering the dielectric film 125 in the second embodiment. Here, the same numbers are given to the same constituent portions as the first and second embodiments described above and the description of the first and second embodiments applies thereto.

The dielectric film 225 of the semiconductor wafer 201 of the third embodiment has a configuration in which 6 layers of a SiN film (for example, a film thickness of 0.17 μm), a $SiO_2$ film (for example, a film thickness of 0.15 μm), a SiN film (for example, a film thickness of 0.25 μm), a $SiO_2$ film (for example, a film thickness of 0.75 μm), a SiN film (for example, a film thickness of 0.25 μm), and a $SiO_2$ film (for example, a film thickness of 0.93 μm) are laminated in order.

Here, regarding the semiconductor wafer 201 described above, as a comparative example, using a semiconductor wafer which has a dielectric film in which 6 layers of a SiN film (a film thickness of 0.17 μm), a $SiO_2$ film (a film thickness of 0.15 μm), a SiN film (a film thickness of 0.25 μm), a $SiO_2$ film (a film thickness of 0.75 μm), a SiN film (a film thickness of 0.25 μm), and a $SiO_2$ film (a film thickness of 3.00 μm) are laminated in order and which is not provided with the shape-changed region 40 on the bottom surface 27a of the dicing groove 27 (the bottom surface 27a of the dicing groove 27 is substantially flat), the relationship between whether or not the shape-changed region 40 is present and the expansion of the surface chipping C and the interlayer cracks P generated at the time of blade dicing was examined. Here, the semiconductor wafer in the comparative example has the same configuration as the semiconductor wafer 201 apart from the configuration relating to the dielectric film and the dicing groove. In addition, in the same manner as the second embodiment, dicing was performed such that the distance from the cutting portion of the dicing groove 27 to the metal ring 22 in a cross-sectional view is 25 μm.

Figure 19:
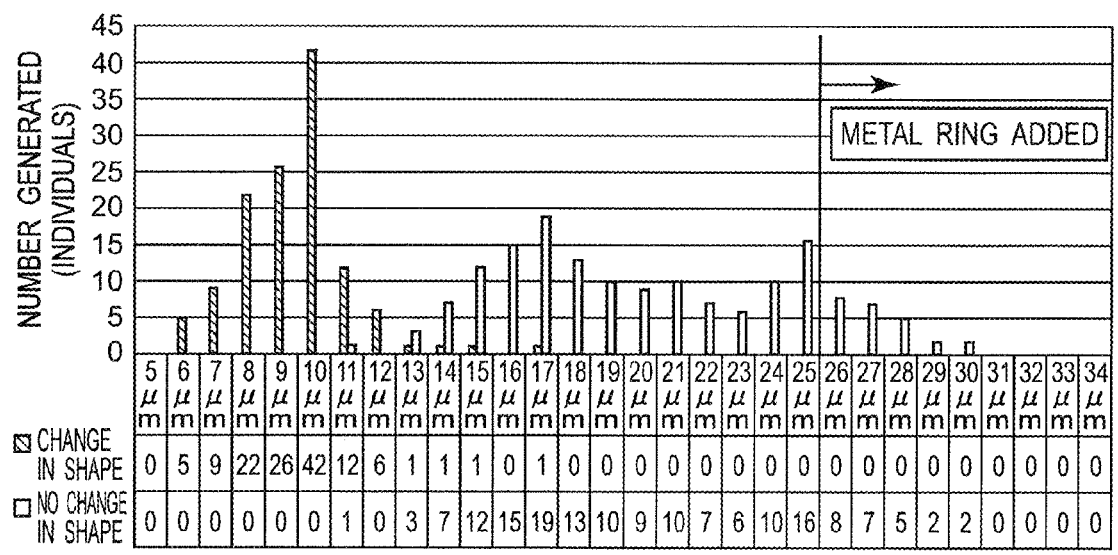
FIG. 19 is a comparative diagram which compares a semiconductor wafer of a third embodiment of the present invention and a semiconductor wafer known in the art with regard to the number of generated interlayer cracks and surface chipping which are generated by dicing.

As shown in FIG. 19, in the semiconductor wafer 201, the expansion of the cracks generated at the time of blade dicing is 10 μm or less in most of the parts and 17 μm as a maximum. With respect to this, a plurality of cracks which expanded over 25 μm was generated in the semiconductor wafer in the comparative example.

In this manner, even when the dielectric film is formed by a plurality of layers of 2 layers or more, it is possible to improve the yield of the diced semiconductor device 70 and to improve the reliability of the diced semiconductor device 70 by suppressing the expansion of cracks, surface chipping, and film peeling.

Here, in a case of configuring the dielectric film of 8 layers, when the total film thickness of the dielectric film is 3.0 μm or less, the dielectric film was confirmed to have the same effects as the dielectric film 225 described above.

Fourth Embodiment

Figure 20:
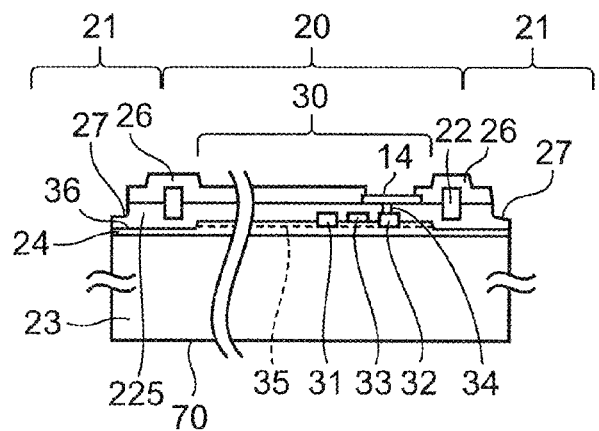
FIG. 20 is a cross-sectional schematic diagram which shows a semiconductor device of a fourth embodiment of the present invention.

A semiconductor device 170 of the fourth embodiment is diced from the semiconductor wafer 201 of the third embodiment described above and is provided with the semiconductor element 30, the bonding pads 14 which are provided on the semiconductor element 30, and the metal ring 22 which is provided so as to surround the semiconductor element 30 as shown in FIG. 20. Here, the same numbers are given to the same constituent portions as the first to third embodiments described above and the description of the first to third embodiments applies thereto.

The semiconductor device 170 described above is cut out such that a part of the dicing groove 27 remains in the periphery of the metal ring 22. For example, the width W0 of the dicing region 21 of the semiconductor wafer 201 is 90 μm and the width W1 of the dicing groove 27 is 70 μm; however, at this time, a part of 10 μm to 15 μm of the dicing groove 27 remains in the periphery of the semiconductor device 170.

Subsequently, description will be given of a method for manufacturing the semiconductor device 170 described above according to FIG. 21 to FIG. 32.

Description will be given of a step for packaging the semiconductor wafer 201 according to FIG. 21 to FIG. 29 prior to the description of the method for manufacturing the semiconductor device 170.

Figure 21:
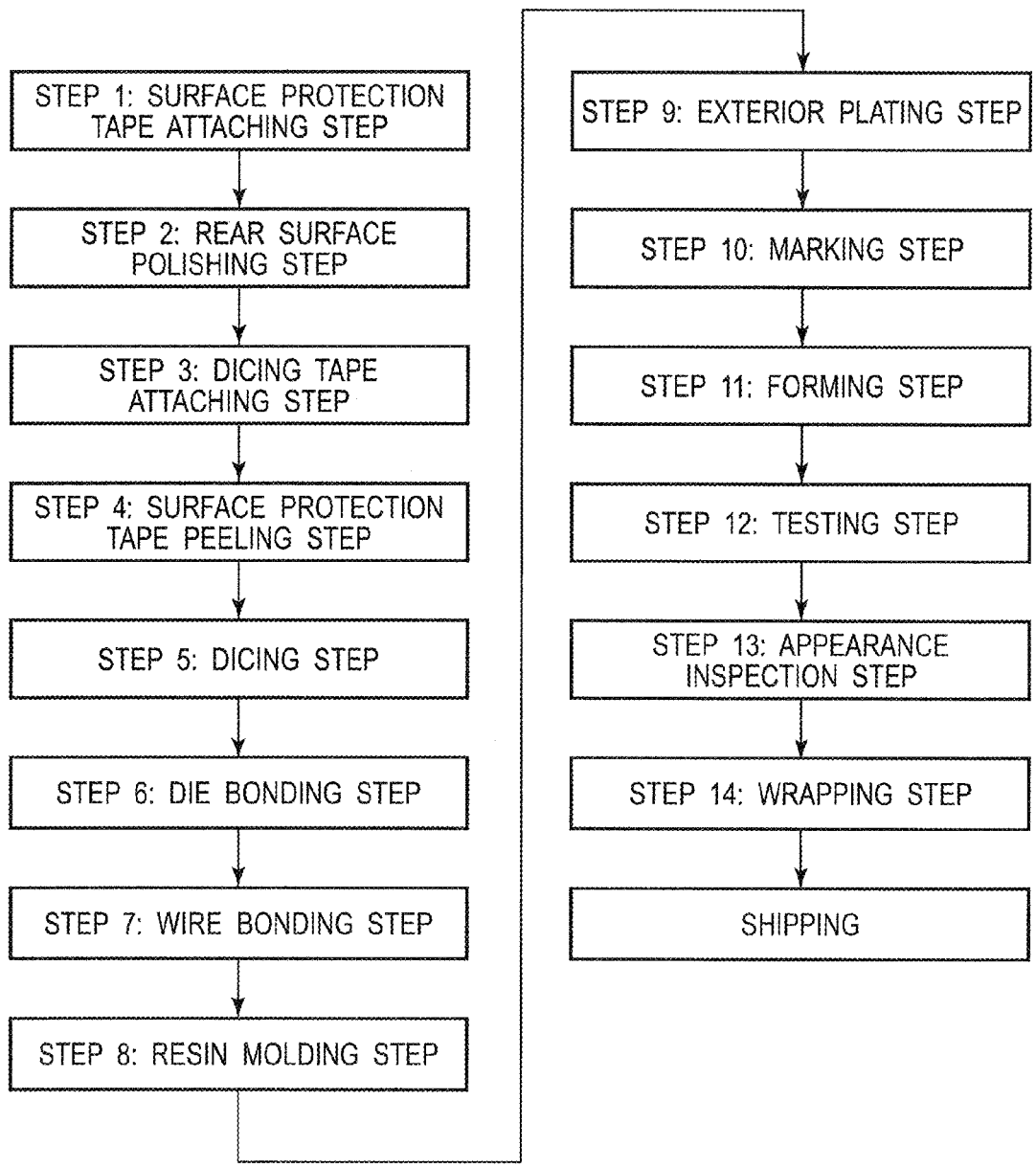
FIG. 21 is a diagram which shows a step for packaging a semiconductor wafer.

As shown in FIG. 21, the semiconductor wafer 201 is packaged and shipped after performing each step of a surface protecting step, a rear surface polishing step, a dicing tape attaching step, a surface protection tape peeling step, a dicing step, a die bonding step, a wire bonding step, a resin molding step, an exterior plating step, a marking step, a forming step, a testing step, an appearance inspection step, and a wrapping step in order.

Figure 22:
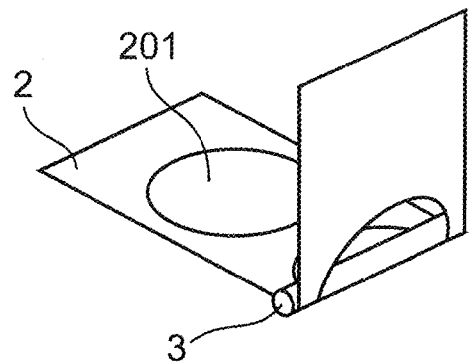
FIG. 22 is a diagram for illustrating a step for attaching a surface protection tape in FIG. 21.

As shown in FIG. 22, the surface protection tape attaching step in step 1 is a step of attaching a surface protection tape 2 in order to protect the surface (a semiconductor element) of the semiconductor wafer 201 from stress or contamination with dust and the like when polishing the rear surface which is the next step.

Figure 23:
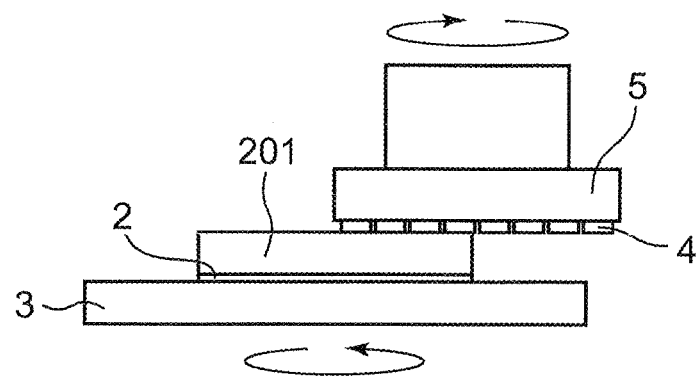
FIG. 23 is a diagram for illustrating a step of polishing a rear surface in FIG. 21.

The rear surface polishing step in step 2 is a step of polishing the semiconductor wafer 201 to which the surface protection tape 2 is attached to a prescribed thickness according to the type of package and a step of carrying out polishing by rotating a polishing stage 3 in which the semiconductor wafer 201 is fixed and a polishing wheel 5 with an attached whetstone 4 as shown in FIG. 23.

Figure 24:
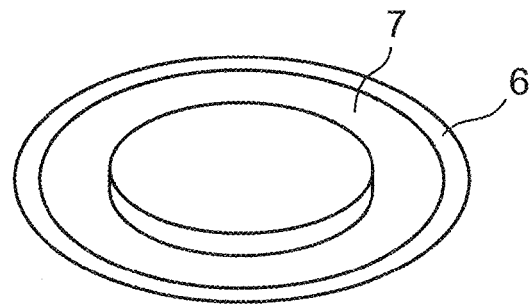
FIG. 24 is a diagram for illustrating a step of attaching a dicing tape in FIG. 21.

As shown in FIG. 24, the tape attaching step in step 3 is a step of attaching the semiconductor wafer 201 to a dicing tape 7 which is attached to a wafer ring 6 as a preparation for dicing which is the next step.

Figure 25:
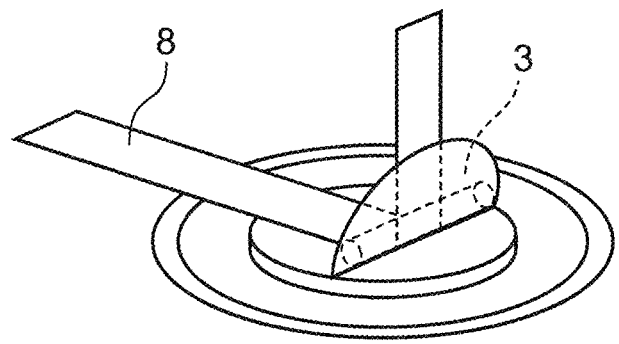
FIG. 25 is a diagram for illustrating a step of peeling the surface protection tape of FIG. 21.

As shown in FIG. 25, the surface protection tape peeling step in step 4 is a step of peeling off the surface protection tape 2 which is attached to the surface of the semiconductor wafer 201 using a peeling tape 8.

Figure 26:
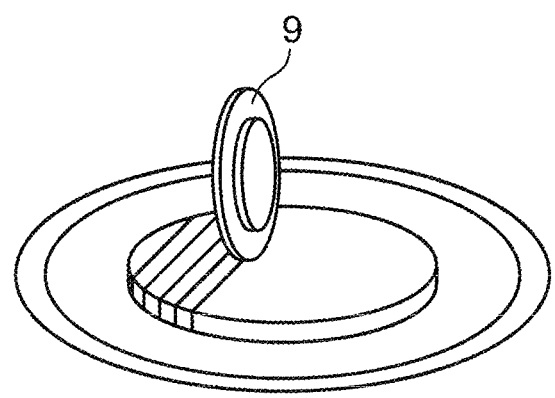
FIG. 26 is a diagram for illustrating a step of dicing of FIG. 21.

As shown in FIG. 26, the dicing step in step 5 is a step of dicing the semiconductor wafer 201 to a prescribed chip size by cutting along the dicing region (scribe line) 21 in the vertical direction and horizontal direction using a dicing blade 9.

Figure 27:
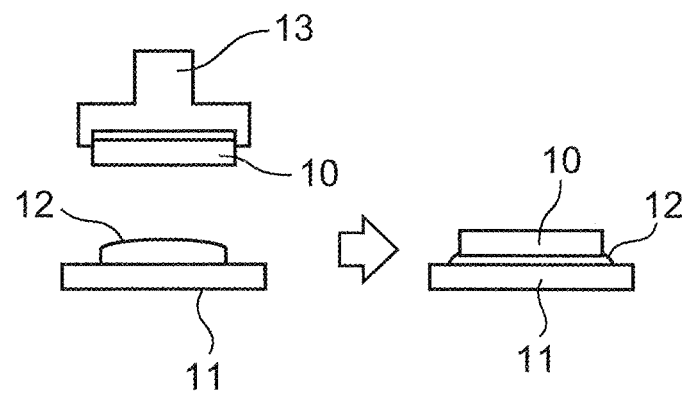
FIG. 27 is a diagram for illustrating a step of die bonding of FIG. 21.

The die bonding step in step 6 is a step of mounting a diced semiconductor chip 10 on a lead frame as shown in FIG. 27. In detail, the die bonding step is a step of coating a paste 12 on an island 11, picking up the diced semiconductor chip 10 using a collect 13, mounting the semiconductor chip 10 at a prescribed position on the paste 12, and carrying out thermosetting.

Figure 28:
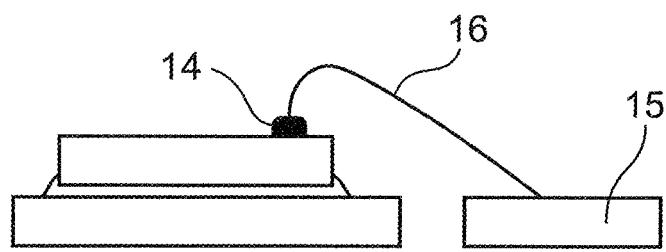
FIG. 28 is a diagram for illustrating a step of wire bonding of FIG. 21.

As shown in FIG. 28, the wire bonding step in step 7 is a step of connecting the bonding pad 14 and a lead 15 of the semiconductor chip 10 mounted on the lead frame using a wire 16. For the wire connection, a gold wire, a silver wire, a copper wire, an aluminum wire, or the like are used.

Figure 29:
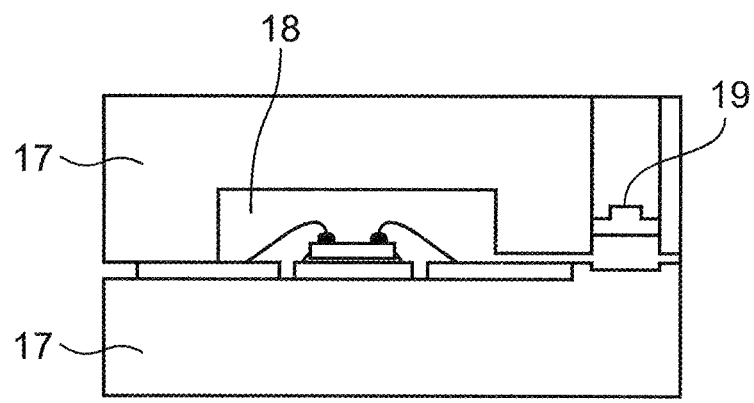
FIG. 29 is a diagram for illustrating a step of resin molding of FIG. 21.

As shown in FIG. 29, the resin molding step in step 8 is a step of forming a package by inserting a plastic resin 18 into a metal mold 17 in which a lead frame is set by a plunger 19 and then carrying out thermosetting.

The exterior plating step in step 9 is a step in which soldering plating is carried out on an outer lead in order to remove molded resin burrs which leak onto the outer lead before plating and then the user carries out soldering on a substrate.

The marking step in step 10 is a step of printing necessary information such as the name of a type of product on a surface of a package. A means for printing using ink such as thermosetting ink, a means for engraving a package surface by laser irradiation, or the like is used for the step of marking.

The forming step in step 11 is a step of cutting and separating each package individually from the lead frame and processing the outer lead into a prescribed shape using a metal mold.

The testing step in step 12 is a step of determining whether the manufactured package is an electrically sound or defective product using a tester.

The appearance inspection step in step 13 is a step of carrying out confirmation of the final appearance state of the device according to the contents of inspection standards. The appearance inspection makes use of a visual inspection in which confirmation is carried out by a person and a measurement inspection using an inspection device.

The wrapping step in step 14 is a step of storing the result in a prescribed shipping form (sleeve wrapping which uses a plastic sleeve, tray wrapping which uses a plastic tray, or tape and reel wrapping which uses an embossed tape), carrying out moisture-proof wrapping by further carrying out aluminum laminate sealing, storing in a specified case, and then shipping.

The above are necessary steps for manufacturing packages.

Next, description will be given of the method for manufacturing the semiconductor device 170 of the fourth embodiment according to FIG. 30 to FIG. 32.

Figure 30:
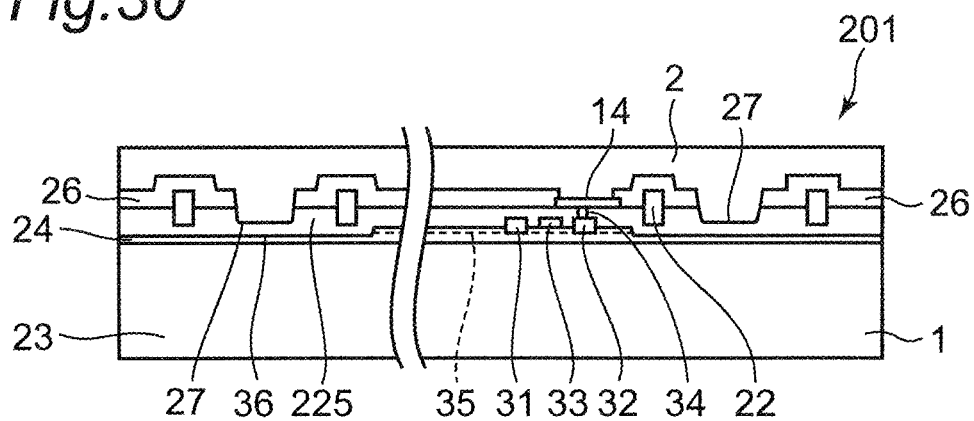
FIG. 30 is a diagram for illustrating a method for manufacturing a semiconductor device in FIG. 20.

Firstly, as shown in FIG. 30, polishing is carried out to a specified polishing thickness by attaching the surface protection tape 2 to the surface of the semiconductor wafer 201 for preventing contamination with dust and the like when polishing a rear surface. At this time, there is a possibility that the wafer will break since the thermal expansion coefficient or the lattice constant is different in the Si substrate 23 and the GaN type semiconductor film 24. The risk may be avoided using a wafer support system (WSS).

Figure 31:
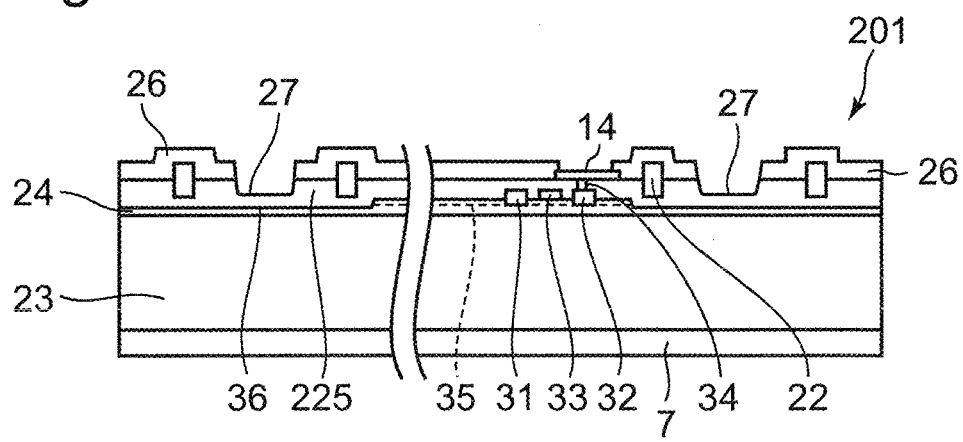
FIG. 31 is a diagram for illustrating the method for manufacturing a semiconductor device following FIG. 30.

Next, as shown in FIG. 31, the polished semiconductor wafer 201 is attached to the dicing tape 7 which is attached to the wafer ring 6, and the surface protection tape 2 is peeled off. At this time, the semiconductor wafer 201 may be attached to the dicing tape 7 after peeling the surface protection tape 2 in advance.

Figure 32:
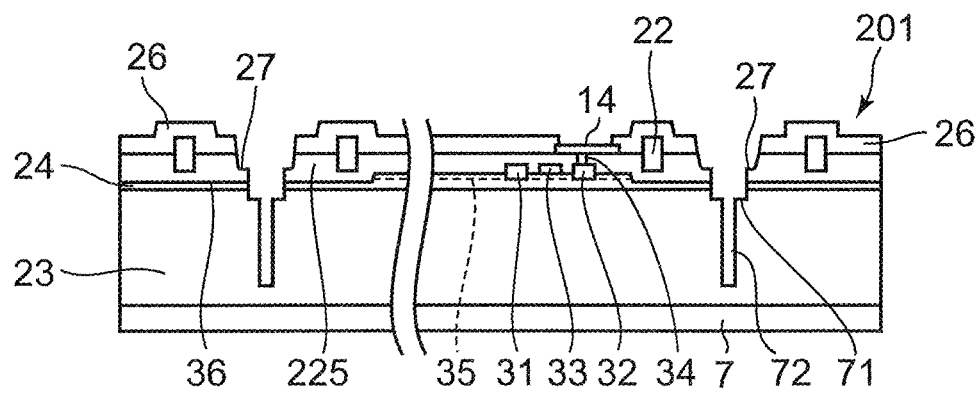
FIG. 32 is a diagram for illustrating the method for manufacturing a semiconductor device following FIG. 31.

Then, as shown in FIG. 32, the semiconductor wafer 201 is cut along the dicing region (scribe line) 21 in vertical and horizontal directions at a blade rotation speed of 30,000 rpm and a cutting speed of 5 mm/s and the semiconductor device 170 is diced by the dicing blade 9.

Here, in the manufacturing method described above, the semiconductor device 170 is diced using the dicing blade 9, not laser dicing. For this reason, it is possible to shorten the cutting time and to manufacture the semiconductor device 170 at a low cost in comparison with a case of using laser dicing with which the cost is high and removal of debris (evaporant residue) is a problem.

In addition, in the manufacturing method described above, since the load on a blade is large in a full cutting method with one cutting and the generation rate of surface chipping or interlayer cracks is high, a step cutting method with two cuttings which uses step cutting which uses a first axis 71 for cutting at least the GaN type semiconductor film and a second axis 72 for cutting the Si substrate. Due to this, it is possible to reduce the load on the blade at the time of blade dicing and reduce the generation rate of the surface chipping and the interlayer cracks.

In this manner, since the semiconductor device 170 described above is diced from the semiconductor wafer 201 which has the shape-changed region 40 which is formed such that the end on the element region 20 side of the dicing groove 27 is higher than the central portion of the dicing groove 27 in the width direction W on the bottom surface 27a of the dicing groove 27, the expansion of the cracks, surface chipping, and film peeling which are generated at the time of blade dicing is suppressed.

In addition, even in a case of using blade dicing with which the manufacturing cost is suppressed without using laser dicing, as shown in FIG. 19, the expansion of the interlayer cracks and surface chipping which are generated at the time of dicing is suppressed up to a region which is substantially 10 μm away from the metal ring 22. For this reason, the semiconductor device 170 which has a high yield and reliability is obtained at a low cost.

The shape-changed region 40 which is formed such that the end of the dicing groove 27 on the element region 20 side described above is higher than the central portion of the dicing groove 27 in the width direction W on the bottom surface 27a of the dicing groove 27 is provided in the first to third embodiments described above; however, the present invention is not limited thereto. For example, a shape-changed region 340 which is formed such that the end of a dicing groove 327 on the element region 20 side is lower than the center of a bottom surface 327a of the dicing groove 327 in a width direction on the bottom surface 327a of the dicing groove 327 may be provided as shown in FIG. 33 and a shape-changed region 440 which is formed so as to have a portion in which the end on the element region 20 side described above of the dicing groove 27 is higher than the central portion of the dicing groove 27 in a width direction in a bottom surface 427a of a dicing groove 427 and a portion in which the end is lower may be provided as shown in FIG. 34.

Figure 33:
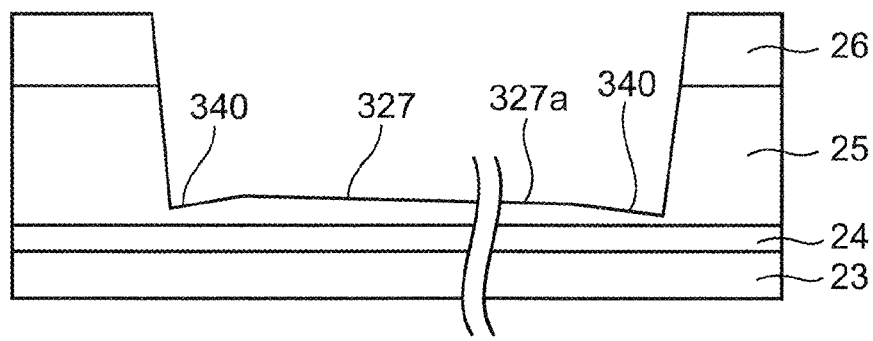
FIG. 33 is a cross-sectional schematic diagram which shows a dicing groove in a semiconductor wafer or a semiconductor device of another embodiment of the present invention.

The dicing groove 327 which has the cross-sectional shape shown in FIG. 33 is obtained, for example, by dry etching using a RIE device in which the RF power is 750 W, the discharge pressure is 1700 mTorr, the flow amount of gas is Ar=800 sccm, CF4=60 sccm, and CHF3=60 sccm.

Figure 34:
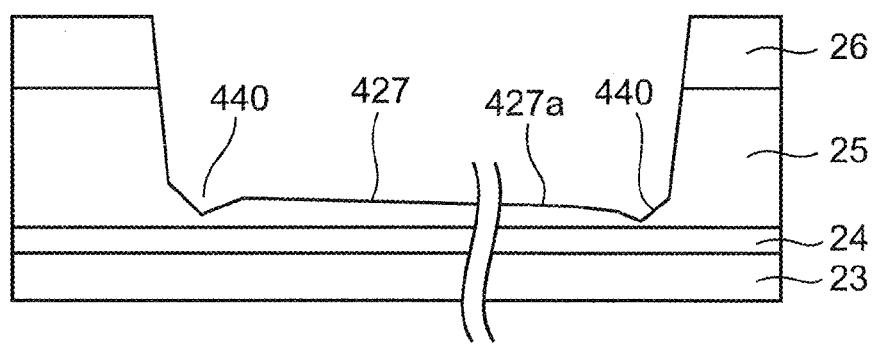
FIG. 34 is a cross-sectional schematic diagram which shows a dicing groove in a semiconductor wafer or a semiconductor device of another embodiment of the present invention.

The dicing groove 427 which has the cross-sectional shape shown in FIG. 34 is obtained, for example, by dry etching using a RIE device in which the RF power is 650 W, the discharge pressure is 1700 mTorr, and the flow amount of gas is Ar=600 sccm, CF4=100 sccm, and CHF3=60 sccm.

In addition, the shape-changed region 40 is formed by changing the film thickness of the dielectric films 25, 125, and 225 on the bottom surface 27a of the dicing groove 27 in the semiconductor wafers 1, 101, and 201 in the first to third embodiments described above; however, the present invention is not limited thereto. For example, as shown in FIG. 34, a shape-changed region 540 may be formed by making the film thickness of the dielectric films 25, 125, and 225 on a bottom surface 527a of a dicing groove 527 substantially constant and changing the film thickness of a protective film 526.

Figure 35:
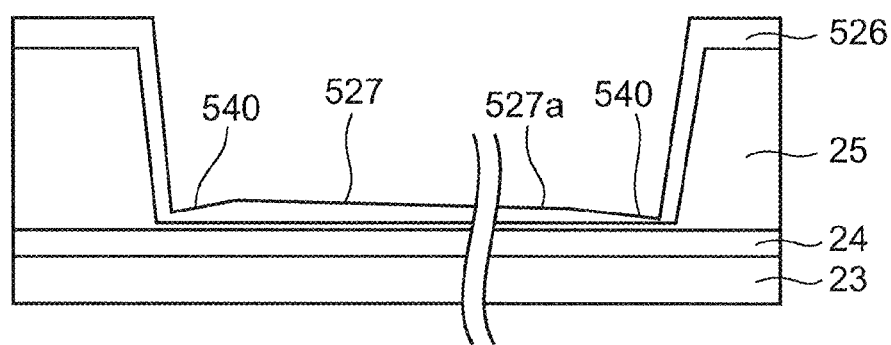
FIG. 35 is a cross-sectional schematic diagram which shows a dicing groove in a semiconductor wafer or a semiconductor device of a different embodiment of the present invention.

The dicing groove 527 which has the cross-sectional shape shown in FIG. 35 is obtained, for example, by forming SiN on the bottom surface 527a by P-CVD after dry etching using a RIE device in which the RF power is 650 W, the discharge pressure is 1700 mTorr, and the flow amount of gas is Ar=600 sccm, CF4=150 sccm, and CHF3=50 sccm.

Fifth Embodiment

Figure 36:
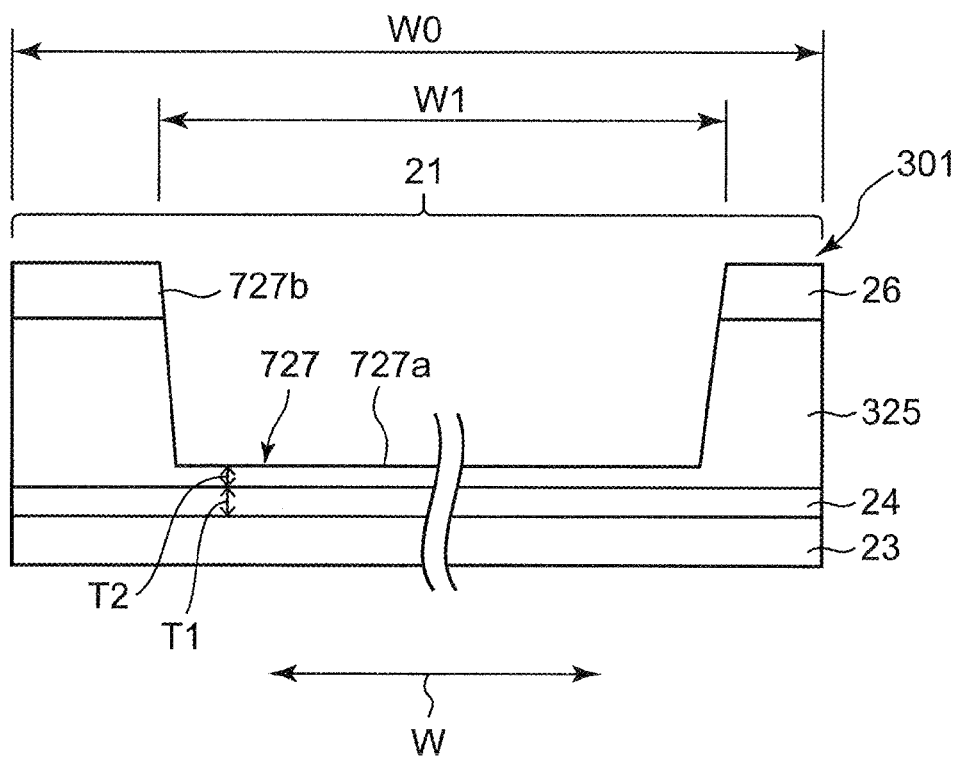
FIG. 36 is a cross-sectional schematic diagram which shows a dicing groove of a semiconductor wafer of a fifth embodiment of the present invention.

A semiconductor wafer 301 of the fifth embodiment of the present invention is different from the semiconductor wafer 1 of the first embodiment in the point of being formed such that the ratio of a film thickness T2 of a dielectric film 325 with respect to a film thickness T1 of the GaN type semiconductor film 24 is 3.3 or less without providing a shape-changed region in the dielectric film 325 on a bottom surface 727a of a dicing groove 727 as shown in FIG. 36. Here, the same numbers are given to the same constituent portions as the first embodiment described above and the description of the first embodiment applies thereto.

In the semiconductor wafer 301 of the fifth embodiment, the film thickness T2 of the dielectric film 325 on the bottom surface 727a of the dicing groove 727 is 0.2 μm to 4 μm, the width W0 of the dicing region 21 is 90 μm, and the width W1 of the dicing groove 27 is 70 μm. In addition, for example, a $SiO_2$ film with a film thickness of 2.0 μm or less which is produced by p-CVD is used as a dielectric film 425.

The dicing groove 727 of the semiconductor wafer 301 is obtained, for example, by dry etching using a RIE device in which the RF power is 650 W, the discharge pressure is 1700 mTorr, and the flow amount of gas is Ar=600 sccm, $CF_4$=150 sccm, and $CHF_3$=50 sccm.

Figure 37:
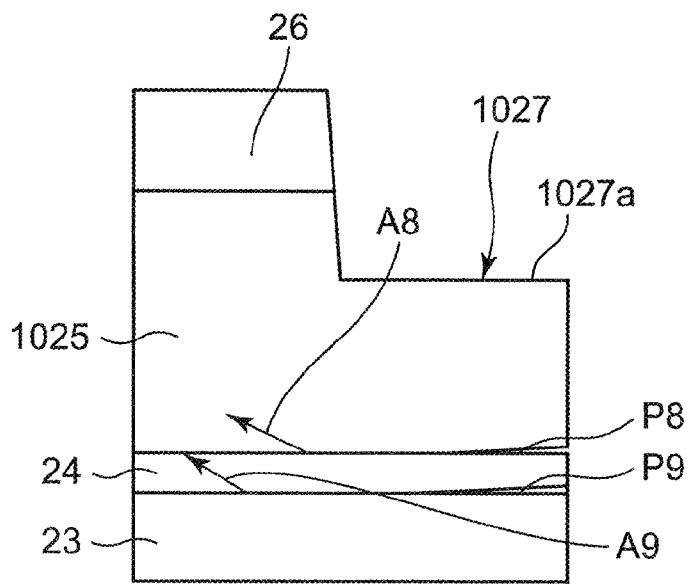
FIG. 37 is a partial cross-sectional schematic diagram which shows the expansion of interlayer cracks and surface chipping which are generated when dicing a semiconductor wafer in which a dielectric film on a bottom surface of a dicing groove is thick.

Here, as shown in FIG. 37, when dicing a semiconductor wafer in which a film thickness of a dielectric film 1025 on a bottom surface 1027a of a dicing groove 1027 is thick and the ratio of the film thickness of the dielectric film 1025 with respect to the film thickness of the GaN type semiconductor film 24 is larger than the semiconductor wafer 301 of the fifth embodiment, stress (a crack) P8 generated in the vicinity of the interface between the GaN type semiconductor film 24 and the dielectric film 1025 is directed in the direction of an arrow A8 and stress (a crack) P9 generated in the vicinity of the interface between the Si substrate 23 and the GaN type semiconductor film 24 is directed in the direction of an arrow A9. For this reason, there are cases where it is not possible to let the stress successfully escape to the outside of the semiconductor wafer.

Here, dicing was performed for each of wafers in which the ratio of the film thickness (T2) of a dielectric film with respect to the film thickness (T1) of a GaN type semiconductor film at the bottom of a dicing groove was changed, and the generation of side cracks at the time of blade dicing (interlayer cracks and surface chipping) was examined. Here, each of the semiconductor wafers used here have the same configuration as the semiconductor wafer 1 apart from the ratio of the film thickness (T2) of the dielectric film with respect to the film thickness (T1) of the GaN type semiconductor film at the bottom of the dicing groove.

Figure 39:
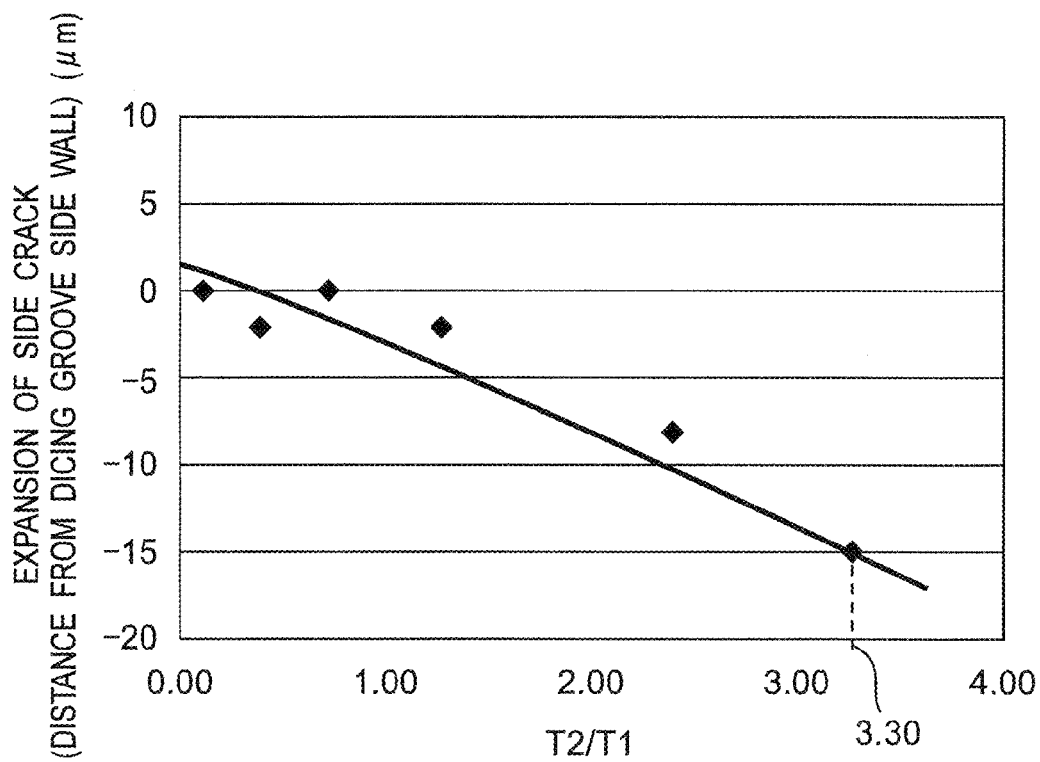
FIG. 39 is a correlation diagram between the expansion widths of side cracks and a T2/T1 film thickness ratio when dicing the semiconductor wafer in FIG. 36.

As shown in FIG. 39, it is understood that when the ratio (T2/T1) of the film thickness (T2) of the dielectric film with respect to the film thickness (Ti) of the GaN type semiconductor film is larger than 3.3, the expansion of the side cracks which expand from a side wall of the dicing groove is large. On the other hand, it is understood that when the ratio (T2/T1) of the film thickness (T2) of the dielectric film with respect to the film thickness (T1) of the GaN type semiconductor film is 3.3 or less, the expansion of the side cracks is suppressed to −15 μm or less and the side cracks do not reach the metal ring 22.

From the results described above, it is understood that, by making the ratio (T2/T1) of the film thickness (T2) of the dielectric film with respect to the film thickness (T1) of the GaN type semiconductor film at the bottom of the dicing groove 3.3 or less, it is possible to improve the yield and to dice the semiconductor device 70 with high reliability by reliably suppressing the expansion of the surface chipping and the interlayer cracks.

Figure 38:
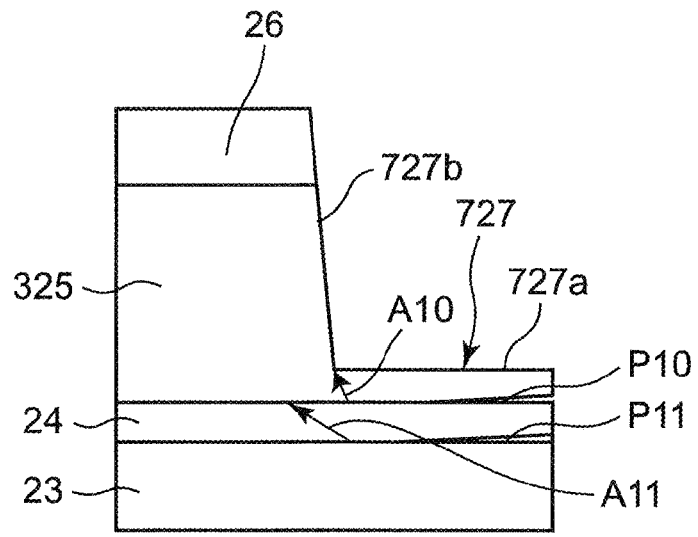
FIG. 38 is a partial cross-sectional schematic diagram which shows the expansion of interlayer cracks and surface chipping which are generated when dicing the semiconductor wafer in FIG. 36.

That is, as shown in FIG. 38, by making the ratio (T2/T1) of the film thickness (T2) of the dielectric film 325 with respect to the film thickness (T1) of the GaN type semiconductor film 24 3.3 or less on the bottom surface 727a of the dicing groove 727, it is possible to direct stress (a crack) P10 generated in the vicinity of the interface between the GaN type semiconductor film 24 and the dielectric film 325 in the direction of an arrow A10. In addition, it is possible to direct stress (a crack) P11 generated in the vicinity of the interface between the Si substrate 23 and the GaN type semiconductor film 24 which are generated when the dicing further proceeds in the direction of an arrow A11. In other words, since it is possible to direct the stress which is generated at the time of dicing, particularly at the time of blade dicing, to the outside of the semiconductor wafer 1, it is possible to improve the yield of the semiconductor device 70 to be diced and to improve the reliability of the semiconductor device 70 to be diced by suppressing the expansion of cracks, surface chipping, and film peeling which are generated at the time of dicing.

Sixth Embodiment

Figure 40:
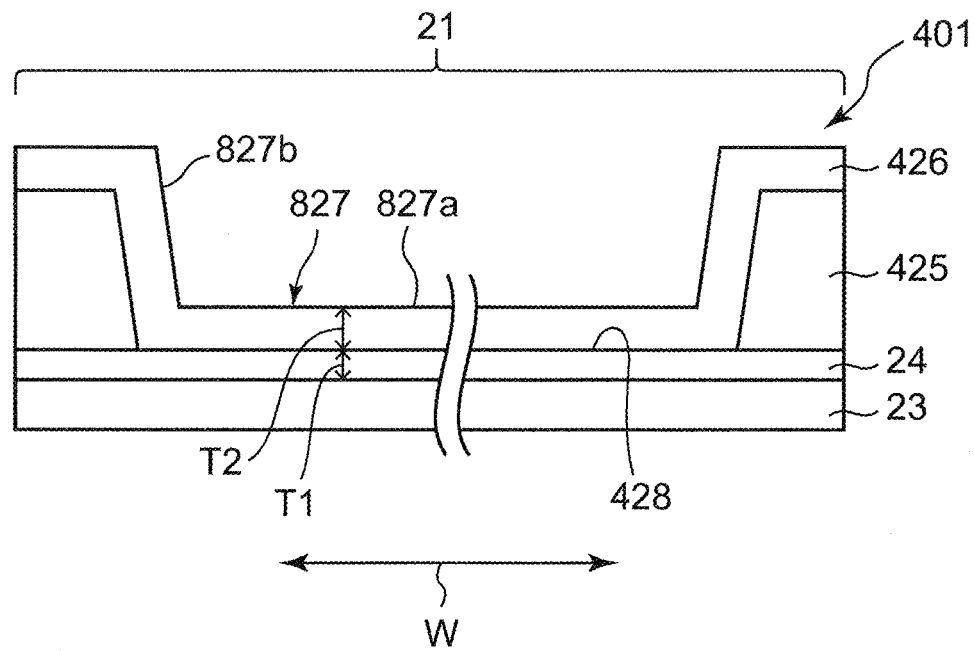
FIG. 40 is a cross-sectional schematic diagram of a semiconductor wafer of a sixth embodiment of the present invention.

As shown in FIG. 40, a semiconductor wafer 401 of the sixth embodiment is different from the semiconductor wafer 301 of the fifth embodiment in the point that a groove portion 428 from which the GaN type semiconductor film 24 is exposed is formed in the dielectric film 425 as a first dielectric film, and then a dicing groove 827 is formed after laminating a protective film 426 as a second dielectric film on the surface of the groove portion 428. Here, the same numbers are given to the same constituent portions as the first embodiment described above and the description of the first embodiment applies thereto.

In a semiconductor wafer 41 of the sixth embodiment, the ratio of the film thickness (T2) of the protective film 426 with respect to the film thickness (Ti) of the GaN type semiconductor film 24 is 3.3 or less on a bottom surface of the dicing groove 827. In addition, for example, a $SiO_2$ film with a film thickness of 2.0 μm or less which is produced by p-CVD is used as the dielectric film 425 and a SiN film with a film thickness of 0.9 μm or less which is produced by p-CVD is used as the protective film 426.

Figure 41:
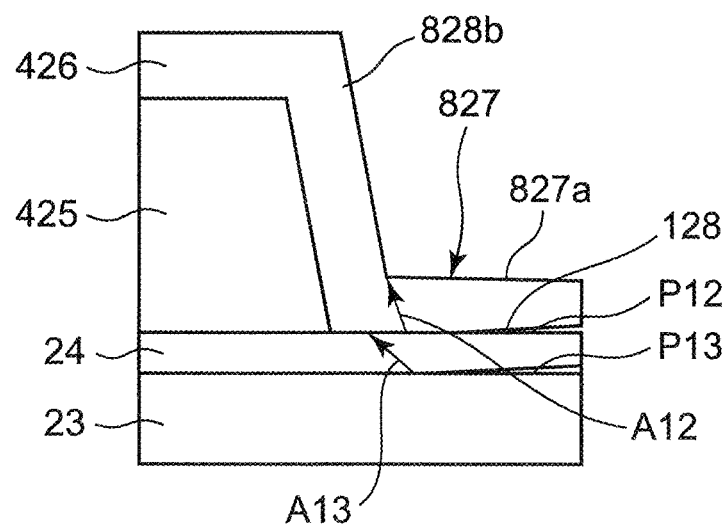
FIG. 41 is a correlation diagram between the width of generated interlayer cracks and the film thickness of the second dielectric film when dicing the semiconductor wafer in FIG. 40.

In the sixth embodiment, as shown in FIG. 41, it is possible to direct stress (a crack) P12 generated in the vicinity of the interface between the protective film 426 and the GaN type semiconductor film 24 before a side wall 827b of the dicing groove 827 in the direction of an arrow A12. In addition, it is possible to direct stress (a crack) P13 generated in the vicinity of the interface between the GaN type semiconductor film 24 and the Si substrate 23 which are generated when the dicing further proceeds in the direction of an arrow A13. In other words, since it is possible to make it difficult for the stress generated by dicing to enter the semiconductor element 30 side from the wall surface 827b of the dicing groove 827 by directing the stress to the outside of the semiconductor wafer 401, it is possible to improve the yield of the diced semiconductor device 70 and to improve the reliability of the diced semiconductor device 70 by reliably suppressing the expansion of cracks, surface chipping, and film peeling.

In addition, since the dicing groove 827 is only formed by processing the dielectric film 425, it is possible to reduce the processing depth of the dicing groove 827. Due to this, it is possible to shorten the processing time of the dicing groove 827 and it is possible to reduce the processing cost by reducing the film thickness of the resist which is used when processing the dicing groove 827.

Here, in the sixth embodiment, the dicing groove 827 is formed by forming the groove portion 428 which passes through the dielectric film 425 and from which the GaN type semiconductor film 24 is exposed and then laminating the protective film 426 on a surface of the groove portion 428; however, the present invention is not limited thereto. 2 or more layers of dielectric films may be laminated on the bottom surface of the dicing groove. That is, when the ratio of the total film thickness (T2) of the dielectric films with respect to the film thickness (T1) of the GaN type semiconductor film on the bottom surface of the dicing groove is 3.3 or less, a part of the dielectric film may remain such that the GaN type semiconductor film is not exposed or a third dielectric film may be laminated on the protective film.

Seventh Embodiment

Figure 42:
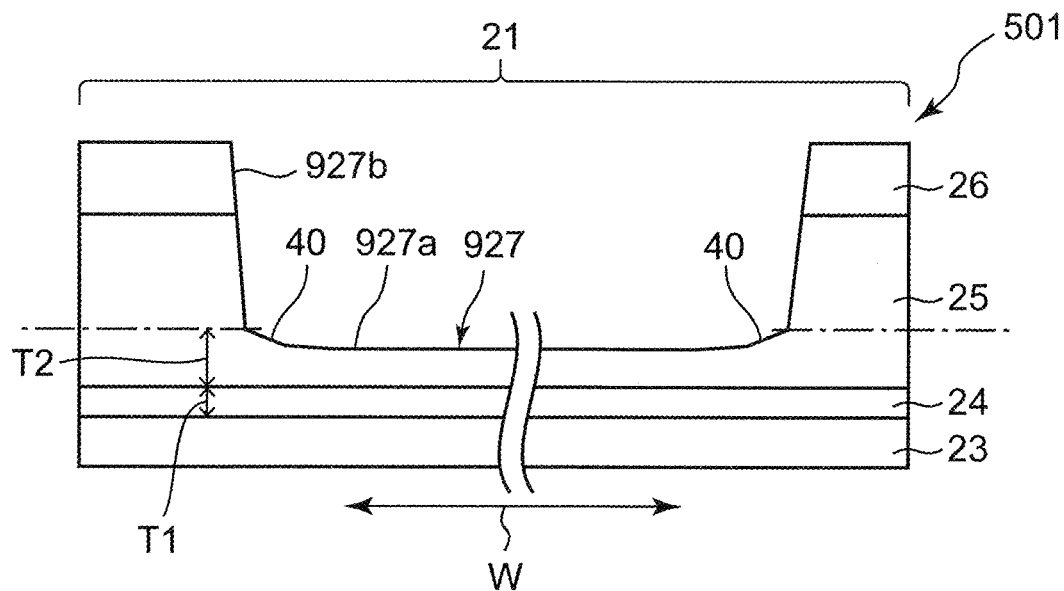
FIG. 42 is a cross-sectional schematic diagram of a semiconductor wafer of a seventh embodiment of the present invention.

As shown in FIG. 42, a semiconductor wafer 501 of the seventh embodiment is different from the semiconductor wafer 1 of the first embodiment in the point of being formed such that the ratio of the film thickness T2 of the dielectric film 25 with respect to the film thickness Ti of the GaN type semiconductor film 24 is 3.3 or less in a state where the shape-changed region 40 is provided on a bottom surface 927a of a dicing groove 927. Here, the same numbers are given to the same constituent portions as the first embodiment described above and the description of the first embodiment applies thereto.

In the semiconductor wafer 501 of the seventh embodiment, a portion in which the shape-changed region 40 is the highest, that is, the largest film thickness of the dielectric film 25 on the bottom surface 927a of the dicing groove 927 is T2.

The dicing groove 27 of the semiconductor wafer 501 of the seventh embodiment is obtained, for example, by dry etching using a RIE device in which the RF power is 750 W, the discharge pressure is 1700 mTorr, and the flow amount of gas is Ar=800 sccm, and CF4=120 sccm.

Figure 43:
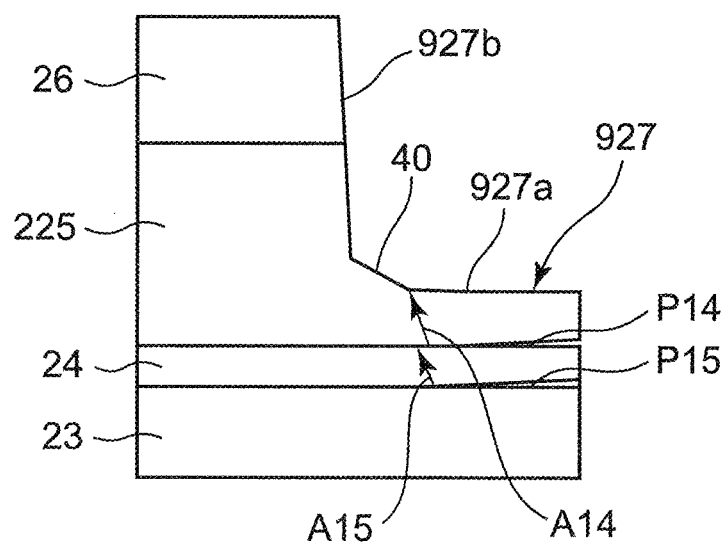
FIG. 43 is a partial cross-sectional schematic diagram which shows the expansion of interlayer cracks and surface chipping which are generated when dicing the semiconductor wafer in FIG. 42.

In addition, as shown in FIG. 43, in the semiconductor wafer 501 with the configuration described above, the shape-changed region 40 is provided on the bottom surface 927a on the element region 20 side of the dicing groove 927, the ratio of the film thickness T2 of the dielectric film 25 with respect to the film thickness T1 of the GaN type semiconductor film 24 is 3.3 or less on the bottom surface 927a of the dicing groove 927, and an end of the element region 20 side described above of the dicing groove 927 is higher than a central portion of the dicing groove 927 in a width direction W. Due to this, it is possible to direct stress (a crack) P14 generated in the vicinity of the interface between the GaN type semiconductor film 24 and the dielectric film 225 in the direction of an arrow A14. In addition, it is possible to direct stress (a crack) P15 generated in the vicinity of the interface between the Si substrate 23 and the GaN type semiconductor film 24 which are generated when the dicing further proceeds in the direction of an arrow A15. In other words, since it is possible to direct the stress which is generated at the time of dicing, particularly at the time of blade dicing, to the outside of the semiconductor wafer 501, it is possible to improve the yield of the semiconductor device 70 to be diced and to improve the reliability of the semiconductor device 70 to be diced by suppressing the expansion of cracks, surface chipping, and film peeling which are generated at the time of dicing.

Here, the generation of interlayer cracks and surface chipping at the time of blade dicing was examined after dicing each of the semiconductor wafer 301 of the fifth embodiment in which the bottom surface of the dicing groove is substantially flat and the semiconductor wafer 501 of the seventh embodiment.

As shown in FIG. 43, in the semiconductor wafer 301 of the fifth embodiment, the surface chipping C and the interlayer cracks P which expand from the cutting portion 57 stop before a wall surface 727b of the dicing groove 727 and do not reach the metal ring 22 at the time of blade dicing.

Figure 44:
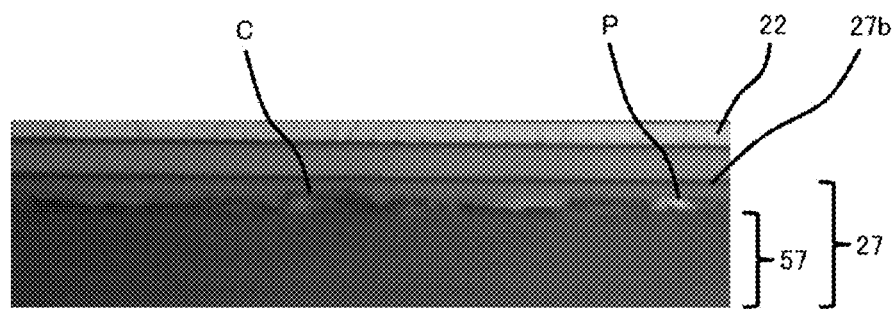
FIG. 44 is a diagram of an optical microscope image which shows a surface of a dicing region when dicing the semiconductor wafer in FIG. 36.
Figure 45:
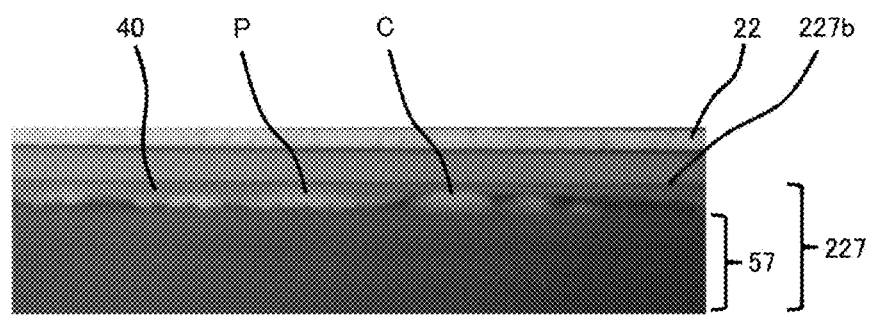
FIG. 45 is a diagram of an optical microscope image which shows a surface of a dicing region when dicing the semiconductor wafer in FIG. 42.

As shown in FIG. 44, even in the semiconductor wafer 501 of the seventh embodiment, the surface chipping C and the interlayer cracks P which expand from the cutting portion 57 stop before a wall surface 927b of the dicing groove 927 and do not reach the metal ring 22 at the time of blade dicing in the same manner as the semiconductor wafer 301 of the fifth embodiment. In particular, the interlayer cracks P stop before the wall surface 927b of the dicing groove 927 in comparison with the semiconductor wafer 301 of the fifth embodiment.

From the results described above, it is understood that, by providing a shape-changed region in an end on an element region side of a bottom surface of a dicing groove and making the ratio of the film thickness T2 of the dielectric film with respect to the film thickness T1 of the GaN type semiconductor film 3.3 or less, it is possible to improve the yield by reliably suppressing the expansion of the surface chipping C and the interlayer crack P and to dice the semiconductor device 70 with high reliability.

Here, the shape-changed region 40 may be formed so as to be lower than a central portion of the dicing groove 927 in a width direction W on the bottom surface 927a of the dicing groove 927 without being limited to a case of being formed so as to be higher than the central portion of the dicing groove 927 in the width direction W.

It is possible to dice each of the semiconductor wafers 301, 401, and 501 of the fifth to seventh embodiments described above into the semiconductor device 170 by the manufacturing method shown in the fourth embodiment.

In addition, description is given of an HFET with a recess structure in which ohmic electrodes reach a GaN layer as the semiconductor element 30 in the first to seventh embodiments described above; however, the present invention is not limited thereto. For example, an HFET in which ohmic electrodes which become a source electrode and a drain electrode are formed on an undoped AlGaN layer without forming a recess may be used as the semiconductor element 30.

In addition, the semiconductor element 30 described above is not limited to an HFET which uses the 2 DEG layer 35 and may be a field effect transistor with another configuration. In addition, the semiconductor element 30 is not limited to a normally-on type HFET and may be a normally-off type semiconductor element. In addition, the semiconductor element 30 is not limited to a Schottky electrode and may be a field effect transistor with an insulated gate structure.

The following summarizes the present invention and the embodiments.

The semiconductor wafers 1, 101, and 201 of the present invention are provided with the substrate 23, the GaN type semiconductor film 24 which is laminated on the substrate 23 described above, the plurality of element regions 20 which have the semiconductor element 30 which is provided on the GaN type semiconductor film 24 described above and the metal ring 22, which is provided on the GaN type semiconductor film 24 described above and disposed so as to surround the semiconductor element 30 described above, the dielectric films 25, 125, and 225 which are laminated on the GaN type semiconductor film 24 described above, and the dicing region 21 which has the dicing groove 27 which opens on the dielectric films 25, 125, and 225 described above and which is provided in a lattice form along a periphery of the metal ring 22 described above so as to partition the element regions 20 described above without passing through the dielectric films 25, 125, and 225 described above, in which an end of the dicing groove 27 on the element regions 20 side described above is higher or lower than a central portion of the dicing groove 27 described above in a width direction W in the bottom surface 27a of the dicing groove 27 described above.

As a result of intensively researching the suppression of cracks, surface chipping, and film peeling which are generated when dicing the semiconductor wafers 1, 101, and 201 which have the GaN type semiconductor film 24 which is grown on the Si substrate 23, particularly at the time of blade dicing, the present inventors discovered that it is possible to suppress the expansion (width) of the cracks, surface chipping, and film peeling which are generated at the time of blade dicing by providing the dicing groove 27 in order for the GaN type semiconductor film 24 not to be exposed to the dielectric films 25, 125, and 225 and further providing the dicing groove 27 such that the end of the dicing groove 27 described above on the element region 20 side described above is higher or lower than the central portion of the dicing groove 27 described above in the width direction W on the bottom surface 27a.

That is, according to the semiconductor wafers 1, 101, and 201 described above, the end of the dicing groove 27 on the element region 20 side described above is higher or lower than the central portion of the dicing groove 27 in the width direction W on the bottom surface 27a of the dicing groove 27. Due to this, since it is possible to suppress the expansion of the cracks, surface chipping, and film peeling by directing the stress which is generated at the time of dicing to the outside of the semiconductor wafers 1, 101, and 201, it is possible to improve the yield of the diced semiconductor devices 70 and 170 and to improve the reliability of the diced semiconductor devices 70 and 170.

In addition, it is possible to obtain the semiconductor devices 70 and 170 with high reliability even without using laser dicing with which the cost is high and removal of debris (evaporant residue) is a problem. For this reason, it is possible to manufacture the semiconductor devices 70 and 170 at a low cost in a short cutting time.

In the semiconductor wafers 101 and 201 in the embodiment, the dielectric films 125 and 225 described above are formed by a multilayer film of at least 2 or more layers.

Furthermore, the present inventors discovered that it is possible to greatly reduce the expansion of the cracks, surface chipping, and film peeling which are generated at the time of dicing, particularly at the time of blade dicing, by making the dielectric films 125 and 225 which cover the bottom portion 27a of the dicing groove 27 a multilayer configuration and making the film thickness of each layer a certain thickness or less.

That is, according to the embodiment described above, since the film thickness of the entirety of the dielectric films 125 and 225 is the same when multi-layering the dielectric films 125 and 225, the film thickness of each layer is small compared to a case of forming the dielectric films 125 and 225 with a single layer. For this reason, it is possible to direct the stress which is generated by dicing to the outside of the semiconductor wafers 101 and 201 at the position before the wall surface 27b of the dicing groove 27. As a result, it is possible to improve the yield of the diced semiconductor devices 70 and 170 and to improve the reliability of the diced semiconductor devices 70 and 170 by reliably suppressing the expansion of the cracks, surface chipping, and film peeling which are generated at the time of dicing.

In addition, the semiconductor devices 70 and 170 of the present invention are diced from the semiconductor wafers 1, 101, and 201 described above and at least a part of the dicing groove 27 described above out of the dicing region 21 described above is cut out so as to remain in the semiconductor devices 70 and 170 described above.

Since the semiconductor devices 70 and 170 described above are diced from the semiconductor wafers 1, 101, and 201 which are formed such that the shape of the bottom surface 27a on the element region 20 side of the dicing groove 27 changes, it is possible to suppress the expansion of the cracks, surface chipping, and film peeling which are generated at the time of dicing.

In addition, it is possible to obtain the semiconductor device 170 with high reliability even without using laser dicing with which the cost is high and removal of debris (evaporant residue) is a problem. For this reason, it is possible to manufacture the semiconductor device 170 at a low cost in a short cutting time.

In addition, the method for manufacturing the semiconductor devices 70 and 170 of the present invention is provided with a step of growing the GaN type semiconductor film 24 on the substrate 23, a step of forming the element region 20 which has the plurality of the semiconductor elements 30 and the metal ring 22, which is disposed so as to surround the semiconductor elements 30 on the GaN type semiconductor film 24, and of laminating the dielectric films 25, 125, and 225, a step of forming the dicing region 21 which has the dicing groove 27 which is provided in a lattice form so as to partition the element region 20, and a step of dicing the dicing groove 27 and cutting out the semiconductor devices 70 and 170 which include the semiconductor element 30 and at least a part of the dicing groove 27, in which the dicing groove 27 is formed such that the end of the element region 20 side of the dicing groove 27 is higher or lower than the central portion of the dicing groove 27 in the width direction W without the GaN type semiconductor film 24 being exposed on the bottom surface 27a of the dicing groove 27.

According to the method for manufacturing the semiconductor devices 70 and 170 with the configuration described above, since the dicing groove 27 is formed such that the end of the element region 20 side described above of the dicing groove 27 described above is higher or lower than the central portion of the dicing groove 27 described above in the width direction W without the GaN type semiconductor film 24 being exposed from the bottom surface 27a, it is possible to direct the stress which is generated by dicing to the outside of the semiconductor wafer 201.

In addition, even in a case of using blade dicing with which the manufacturing cost is suppressed without using laser dicing with a high cost, it is possible to suppress the expansion of the interlayer cracks and surface chipping which are generated at the time of dicing. For this reason, it is possible to provide the semiconductor devices 70 and 170 with high yield and reliability at a low cost.

Furthermore, even when a high voltage is applied, the GaN type semiconductor film 24 is not exposed from the surface of the bottom surface of the dicing groove 27. For this reason, in a case of testing the semiconductor element 30 in a wafer state, it is possible to carry out a pressure proof test or the like by applying a high voltage in a wafer state without destroying the semiconductor element 30.

In a method for manufacturing a semiconductor device in the embodiment, the semiconductor devices 70 and 170 are diced by blade dicing which uses a dicing blade.

According to the embodiment described above, since blade dicing is used, it is possible to provide the semiconductor devices 70 and 170 in a short cutting time and at a low cost compared to laser dicing with which the cost is high and removal of debris (evaporant residue) is a problem.

In the method for manufacturing a semiconductor device in the embodiment, the blade dicing described above is performed by step cutting which uses a first axis for cutting the GaN type semiconductor film 24 described above and a second axis for cutting the substrate 23 described above.

According to the embodiment described above, it is possible to reduce the on the dicing blade at the time of blade dicing and reduce the generation of the relational cracks and surface chipping.

In addition, the semiconductor wafers 301, 401, and 501 of the present invention are provided with the substrate 23, the GaN type semiconductor film 24 which is laminated on the substrate 23 described above, the plurality of element regions 20 which have the semiconductor element 30 which is provided on the GaN type semiconductor film 24 and the metal ring 22 which is provided on the GaN type semiconductor film 24 described above and disposed so as to surround the semiconductor element 30, the dielectric films 25, 26, 325, 425, and 426 of at least one layer which are laminated on the GaN type semiconductor film 24 described above, and the dicing region 21 which has dicing grooves 727, 827, and 927 which open on the dielectric films 25, 26, 325, 425, and 426 described above and which are provided in a lattice form along a periphery of the metal ring 22 described above so as to partition the element regions 20 described above without exposing the GaN type semiconductor film 24 described above, in which a ratio of a total film thickness of the dielectric films 25, 26, 325, 425, and 426 described above is 3.3 or less with respect to a film thickness of the GaN type semiconductor film 24 described above in the bottom surfaces 727a, 827a, and 927a of the dicing grooves 727, 827, and 927 described above.

As a result of intensively researching the suppression of cracks, surface chipping, and film peeling which are generated when dicing the semiconductor wafers 301, 401, and 501 which have the GaN type semiconductor film 24 which is grown on the Si substrate 23, particularly at the time of blade dicing, the present inventors discovered that it is possible to suppress the expansion (width) of the cracks, surface chipping, and film peeling which are generated at the time of blade dicing by providing the dicing grooves 727, 827, and 927 such that the GaN type semiconductor film 24 is not exposed in the dielectric films 25, 26, 325, 425, and 426 and moreover, making the ratio of the total film thickness of the dielectric films 25, 26, 325, 425, and 426 described above with respect to the film thickness of the GaN type semiconductor film 24 3.3 or less on the bottom surfaces 727a, 827a, and 927a of the dicing grooves 727, 827, and 927.

That is, according to the semiconductor wafers 301, 401, and 501 with the configuration described above, the ratio of the total film thickness of the dielectric films 25, 26, 325, 425, and 426 described above with respect to the film thickness of the GaN type semiconductor film 24 described above is 3.3 or less on the bottom surfaces 727a, 827a, and 927a of the dicing grooves 727, 827, and 927. Due to this, since it is possible to suppress the expansion of the cracks, surface chipping, and film peeling by directing the stress which is generated at the time of dicing to the outside of the semiconductor wafers 301, 401, and 501, it is possible to improve the yield of the diced semiconductor devices 70 and 170 and to improve the reliability of the diced semiconductor devices 70 and 170.

In addition, it is possible to obtain the semiconductor device 70 with high reliability even without using laser dicing with which the cost is high and removal of debris (evaporant residue) is a problem. For this reason, it is possible to manufacture the semiconductor device 70 at a low cost in a short cutting time.

In the semiconductor wafer 401 in the embodiment, the dielectric films 425 and 426 described above include at least first and second dielectric films 425 and 426 which are laminated on the GaN type semiconductor film 24 described above, and the dicing groove 827 described above is formed by forming the groove portion 428 which passes through the first dielectric film 425 described above and in which the GaN type semiconductor film 24 is exposed, and then laminating at least the second dielectric film 426 described above on a surface of the groove portion 428.

Furthermore, the present inventors discovered that it is possible to greatly reduce the expansion of the cracks, surface chipping, and film peeling generated at the time of dicing, particularly at the time of blade dicing, by forming the groove portion 428 which passes through the first dielectric film 425 and in which the GaN type semiconductor film 24 is exposed, and then laminating at least the second dielectric film 426 on a surface of the groove portion 428 to form the dicing groove 827.

That is, according to the embodiment described above, it is possible to direct the stress which is generated by dicing to the outside of the semiconductor wafer 401 at the position before the wall surface 827b of the dicing groove 827. As a result, it is possible to improve the yield of the diced semiconductor devices 70 and 170 and to improve the reliability of the diced semiconductor devices 70 and 170 by reliably suppressing the expansion of the cracks, surface chipping, and film peeling which are generated at the time of dicing.

In the semiconductor wafer 501 in the embodiment, the end on the element region 20 side described above in the width direction of the bottom surface 927a of the dicing groove 927 described above is higher or lower than the central portion of the dicing groove 927 described above in the width direction.

According to the semiconductor wafer 501 of this embodiment, the ratio of the total film thickness of the dielectric films 25 and 26 described above with respect to the film thickness of the GaN type semiconductor film 24 is 3.3 or less on the bottom surface 927a of the dicing groove 927 and the end on the element region 20 side described above of the dicing groove 927 is higher or lower than the central portion of the dicing groove 927 in the width direction W. Due to this, since it is possible to suppress the expansion of the cracks, surface chipping, and film peeling by directing the stress which is generated at the time of dicing to the outside of the semiconductor wafer 501, it is possible to improve the yield of the diced semiconductor devices 70 and 170 and to improve the reliability of the diced semiconductor devices 70 and 170.

In addition, the semiconductor devices 70 and 170 of the present invention are diced from the semiconductor wafers 301, 401, and 501 described above and at least a part of the dicing grooves 727, 827, and 927 described above out of the dicing region 21 described above is cut out so as to remain in the semiconductor devices 70 and 170 described above.

Since the semiconductor devices 70 and 170 with the configuration described above are diced from the semiconductor wafers 301, 401, and 501 which are formed such that the ratio of the total film thickness of the dielectric films 25, 26, 325, 425, and 426 described above with respect to the film thickness of the GaN type semiconductor film 24 described above is 3.3 or less, it is possible to suppress the expansion of the cracks, surface chipping, and film peeling which are generated at the time of dicing.

In addition, the method for manufacturing the semiconductor devices 70 and 170 of the present invention is provided with a step of growing the GaN type semiconductor film 24 on the substrate 23, a step of forming the element region 20 which has the plurality of the semiconductor elements 30 and the metal ring 22, which is disposed so as to surround the semiconductor elements 30 on the GaN type semiconductor film 24 described above, and of laminating the dielectric films 25, 26, 325, 425, and 426 of at least one layer, a step of forming the dicing region 21 which has the dicing grooves 727, 827, and 927 which are provided in a lattice form so as to partition the element region 20 described above, and a step of dicing the dicing grooves 727, 827, and 927 described above and cutting out the semiconductor devices 70 and 170 which include the semiconductor element 30 described above and at least a part of the dicing grooves 727, 827, and 927 described above, in which the dicing grooves 727, 827, and 927 described above are formed such that the GaN type semiconductor film 24 described above is not exposed on the bottom surfaces 727a, 827a, and 927a of the dicing grooves 727, 827, and 927 described above and the ratio of the total film thickness of the dielectric films 25, 26, 325, 425, and 426 described above with respect to the film thickness of the GaN type semiconductor film 24 described above is 3.3 or less.

According to the method for manufacturing the semiconductor devices 70 and 170 with the configuration described above, since the dicing grooves 727, 827, and 927 are formed such that the GaN type semiconductor film 24 is not exposed from the bottom surfaces 727a, 827a, and 927a and the ratio of the total film thickness of the dielectric films 25, 26, 325, 425, and 426 with respect to the film thickness of the GaN type semiconductor film 24 is 3.3 or less, it is possible to direct the stress which is generated by dicing to the outside of the semiconductor wafers 301, 401, and 501.

In addition, even in a case of using blade dicing in which the manufacturing cost is suppressed without using laser dicing with a high cost, it is possible to suppress the expansion of the interlayer cracks and surface chipping which are generated at the time of dicing. For this reason, it is possible to provide the semiconductor devices 70 and 170 with high yield and reliability at a low cost.

Furthermore, even when applying a high voltage, the GaN type semiconductor film 24 is not exposed from the surface of the bottom surfaces 727a, 827a, and 927a of the dicing grooves 727, 827, and 927. For this reason, in a case of testing the semiconductor element 30 in a wafer state, it is possible to carry out a pressure proof test or the like by applying a high voltage in a wafer state without destroying the semiconductor element 30.

The constituent elements described in the first to seventh embodiments and modification examples described above may be appropriately combined and, naturally, may be also appropriately selected, substituted, or removed.

REFERENCE SIGNS LIST

1, 101, 201, 301, 401, 501 SEMICONDUCTOR WAFER
14 BONDING PAD
20 ELEMENT REGION
21 DICING REGION
22 METAL RING
23 SUBSTRATE
24 GaN TYPE SEMICONDUCTOR FILM
25, 125, 225, 325, 425 DIELECTRIC FILM
26, 126, 426, 526 PROTECTIVE FILM
27, 727, 827, 927 DICING GROOVE
27a, 327a, 427a, 527a, 727a, 827a, 827a 927a BOTTOM SURFACE
27b WALL SURFACE
30 SEMICONDUCTOR ELEMENT
31 SOURCE ELECTRODE
32 DRAIN ELECTRODE
34 GATE ELECTRODE
34 VIA
35 2 DEG LAYER
36 ELEMENT SEPARATING GROOVE
40, 340, 440, 540 SHAPE-CHANGED REGION
70, 170 SEMICONDUCTOR DEVICE
428 GROOVE PORTION

The invention claimed is:

1. A semiconductor wafer comprising:
   a substrate;
   a GaN type semiconductor film which is laminated on the substrate;
   a plurality of element regions which have a semiconductor element which is provided on the GaN type semiconductor film and a metal ring, which is provided on the GaN type semiconductor film and disposed so as to surround the semiconductor element;
   dielectric films which are laminated on the GaN type semiconductor film; and
   a dicing region which has a dicing groove having a bottom and in which the GaN type semiconductor film is arranged between the substrate and the entire bottom of the dicing groove, the dicing groove opening on the dielectric films and being provided in a lattice form along a periphery of the metal ring so as to partition the element regions without passing through the dielectric films,
   wherein an end on the element regions side of the dicing groove is higher or lower than a central portion of the dicing groove in a width direction in a bottom surface of the dicing groove.

2. The semiconductor wafer according to claim 1, wherein the dielectric films are formed by a multilayer film of at least two or more layers.

3. A semiconductor device diced from the semiconductor wafer according to claim 1,
   wherein at least a part of the dicing groove out of the dicing region is cut out so as to remain in the semiconductor device.

4. A method for manufacturing a semiconductor device comprising:
   a step of growing a GaN type semiconductor film on a substrate;
   a step of forming element regions which have the plurality of semiconductor elements and metal rings disposed so as to surround the semiconductor elements on the GaN type semiconductor film and of laminating dielectric films;

a step of forming a dicing region which has a dicing groove having a bottom and in which GaN type semiconductor film is arranged between the substrate and the entire bottom of the dicing groove, the dicing groove being provided in a lattice form so as to partition the element region; and a step of dicing the dicing groove and cutting out semiconductor devices which include the semiconductor element and at least a part of the dicing groove, wherein the dicing groove is formed such that an end of the element region side of the dicing groove is higher or lower than a central portion of the dicing groove in the width direction without the GaN type semiconductor film being exposed in a bottom surface of the dicing groove.

5. The method for manufacturing a semiconductor device according to claim 4, wherein the semiconductor devices are diced by blade dicing which uses a dicing blade.

6. A semiconductor wafer comprising:

a substrate;

a GaN type semiconductor film which is laminated on the substrate;

a plurality of element regions which have a semiconductor element which is provided on the GaN type semiconductor film and a metal ring, which is provided on the GaN type semiconductor film and disposed so as to surround the semiconductor element;

at least one layer of dielectric films which are laminated on the GaN type semiconductor film; and a dicing region which has dicing grooves, each dicing groove having a bottom and in which the GaN type semiconductor film is arranged between the substrate and the entire bottom of each dicing groove, each dicing groove opening on the dielectric films and being provided in a lattice form along a periphery of the metal ring so as to partition the element regions without exposing the GaN type semiconductor film, wherein a ratio of a total film thickness of the dielectric films is 3.3 or less with respect to a film thickness of the GaN type semiconductor film in bottom surfaces of the dicing grooves.

7. The semiconductor wafer according to claim 6, wherein the dielectric films include at least first and second dielectric films which are laminated on the GaN type semiconductor film, and the dicing groove is formed by forming a groove portion which passes through the first dielectric film and in which the GaN type semiconductor film is exposed, and then laminating at least the second dielectric film on a surface of the groove portion.

8. The semiconductor wafer according to claim 6, wherein an end on the element region side in a width direction of the bottom surfaces of the dicing grooves is higher or lower than a central portion of the dicing grooves in the width direction.

9. The semiconductor devices diced from the semiconductor wafer according to claim 6, wherein at least a part of the dicing grooves out of the dicing region is cut out so as to remain in the semiconductor devices.

10. A method for manufacturing a semiconductor device comprising:

a step of growing a GaN type semiconductor film on a substrate;

a step of forming an element region which has a plurality of semiconductor elements and metal rings which are disposed so as to surround the semiconductor elements on the GaN type semiconductor film and of laminating at least one layer of a dielectric film;

a step of forming a dicing region which has dicing grooves, each dicing groove having a bottom and in which the GaN type semiconductor film is arranged between the substrate and the entire bottom of the dicing groove, the dicing grooves being provided in a lattice form so as to partition the element region; and a step of dicing the dicing grooves and cutting out semiconductor devices which include the semiconductor element and at least a part of the dicing groove, wherein the dicing grooves are formed such that a ratio of a total film thickness of the dielectric films is 3.3 or less with respect to a film thickness of the GaN type semiconductor film without the GaN type semiconductor film being exposed in bottom surfaces of the dicing grooves.

* * * * *